(12) United States Patent
Pitner et al.

(10) Patent No.: US 11,342,035 B1
(45) Date of Patent: May 24, 2022

(54) MEMORY APPARATUS AND METHOD OF OPERATION USING ONE PULSE SMART VERIFY

(71) Applicant: SanDisk Technologies LLC, Addison, TX (US)

(72) Inventors: Xue Bai Pitner, Sunnyvale, CA (US); Deepanshu Dutta, Fremont, CA (US); Ravi Kumar, Redwood City, CA (US)

(73) Assignee: SanDisk Technologies LLC, Addison, TX (US)

( * ) Notice: Subject to any disclaimer, the term of this patent is extended or adjusted under 35 U.S.C. 154(b) by 2 days.

(21) Appl. No.: 17/102,657

(22) Filed: Nov. 24, 2020

(51) Int. Cl.
*G11C 16/26* (2006.01)
*G11C 16/34* (2006.01)
*G11C 16/30* (2006.01)
*G11C 16/10* (2006.01)
*G11C 16/08* (2006.01)

(52) U.S. Cl.
CPC .......... *G11C 16/3454* (2013.01); *G11C 16/08* (2013.01); *G11C 16/10* (2013.01); *G11C 16/26* (2013.01); *G11C 16/30* (2013.01); *G11C 16/3404* (2013.01)

(58) Field of Classification Search
CPC ..... G11C 16/3454; G11C 16/08; G11C 16/10; G11C 16/26; G11C 16/30; G11C 16/3404
See application file for complete search history.

(56) References Cited

U.S. PATENT DOCUMENTS

| 7,023,736 | B2 | 4/2006 | Cernea et al. |
| 7,046,568 | B2 | 5/2006 | Cernea |
| 7,196,928 | B2 | 3/2007 | Chen |
| 7,196,931 | B2 | 3/2007 | Cernea et al. |
| 7,327,619 | B2 | 2/2008 | Chan et al. |
| 7,907,449 | B2 | 3/2011 | Lee et al. |
| 8,214,700 | B2 | 7/2012 | Chen |
| 8,861,280 | B2 | 10/2014 | Costa et al. |
| 9,036,415 | B2 | 5/2015 | Sharon |
| 9,214,240 | B2 | 12/2015 | Dutta et al. |
| 9,252,817 | B2 | 2/2016 | Pan et al. |
| 9,269,446 | B1 | 2/2016 | Magia et al. |
| 9,852,800 | B2 | 12/2017 | Lang et al. |
| 2017/0243658 | A1* | 8/2017 | Lee .................. G11C 16/12 |

* cited by examiner

*Primary Examiner* — Xiaochun L Chen
(74) *Attorney, Agent, or Firm* — Dickinson Wright PLLC; Steven C. Hurles

(57) ABSTRACT

A memory apparatus and method of operation is provided. The apparatus includes a block of memory cells each connected to one of a plurality of word lines and arranged in strings and configured to retain a threshold voltage. A control circuit couples to the word lines and the strings determines a program lower tail voltage of a distribution of the threshold voltage following a first program pulse. The control circuit calculates a second program voltage of a second program pulse based on the program lower tail voltage and applies the second program pulse to each of selected ones of the plurality of word lines associated with the memory cells to program the memory cells such that the distribution of the threshold voltage of the memory cells have a desired program lower tail voltage without further program pulses.

20 Claims, 18 Drawing Sheets

DETERMINING A PROGRAM LOWER TAIL VOLTAGE OF A DISTRIBUTION OF THE THRESHOLD VOLTAGE OF THE MEMORY CELLS FOLLOWING A FIRST PROGRAM PULSE OF A PROGRAM OPERATION HAVING A FIRST PROGRAM VOLTAGE, THE PROGRAM LOWER TAIL VOLTAGE CORRESPONDING TO A CYCLING CONDITION OF THE MEMORY CELLS — 700

CALCULATING A SECOND PROGRAM VOLTAGE OF A SECOND PROGRAM PULSE OF THE PROGRAM OPERATION BASED ON THE PROGRAM LOWER TAIL VOLTAGE AND APPLY TO EACH OF SELECTED ONE OF THE PLURALITY OF WORD LINES ASSOCIATED WITH THE MEMORY CELLS TO PROGRAM THE MEMORY CELLS SUCH THAT THE DISTRIBUTION OF THE THRESHOLD VOLTAGE OF THE MEMORY CELLS HAVE A DESIRED PROGRAM LOWER TAIL VOLTAGE WITHOUT FURTHER PROGRAM PULSES — 702

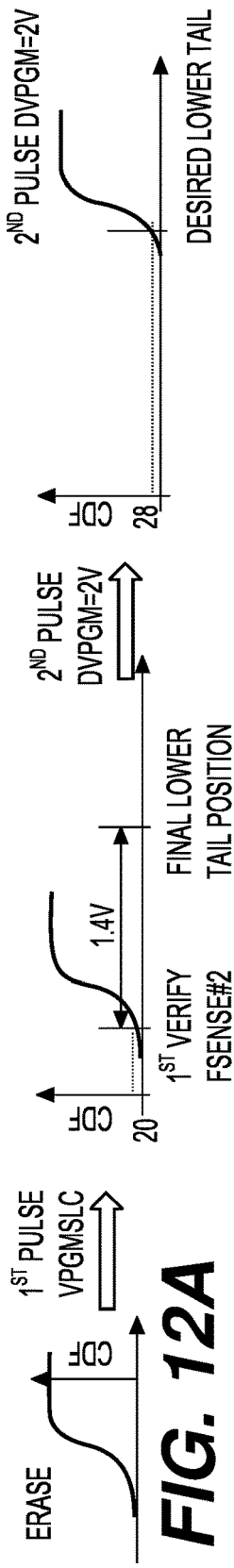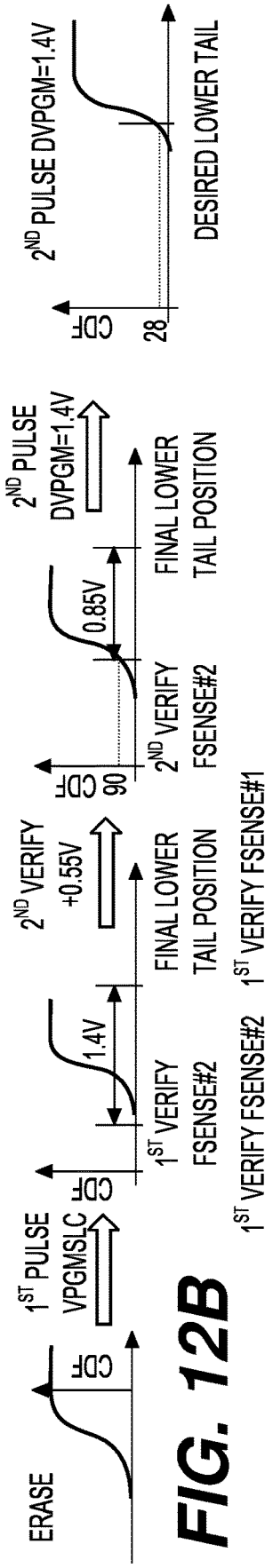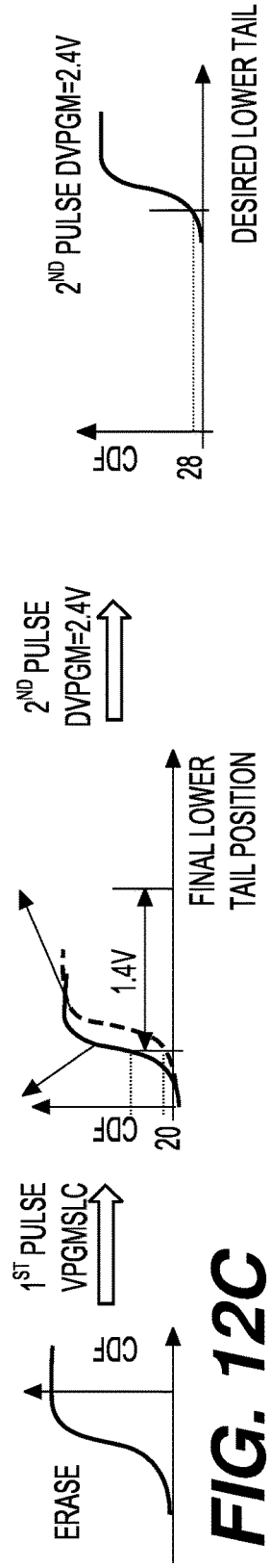
FIG. 12A
FIG. 12B
FIG. 12C

| STR0 PULSES | 1-PULSE SV | 1P0V | SV |
|---|---|---|---|
| ESTIMATED tPROG FOR STR0 (FROM B4X4 CHIP) | 2PULSES | 1PULSE | 2~3PULSES |
| | 160US~190US (1-2 VERIFIES) | 130US | 233US~330US |
| RISK OF OVER PROGRAM | NO | YES | NO |
| ON-NAND ADAPTIVE VPGM | YES | NO | YES |

*FIG. 13*

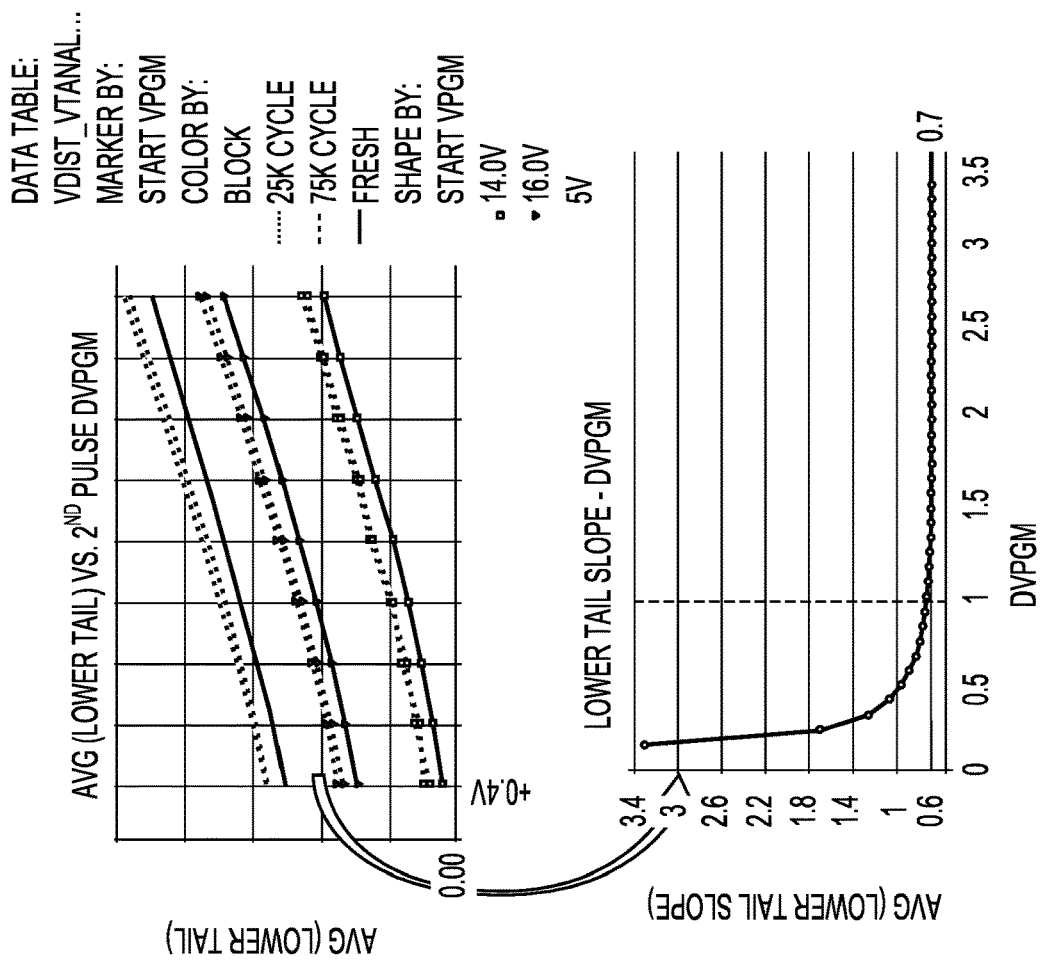
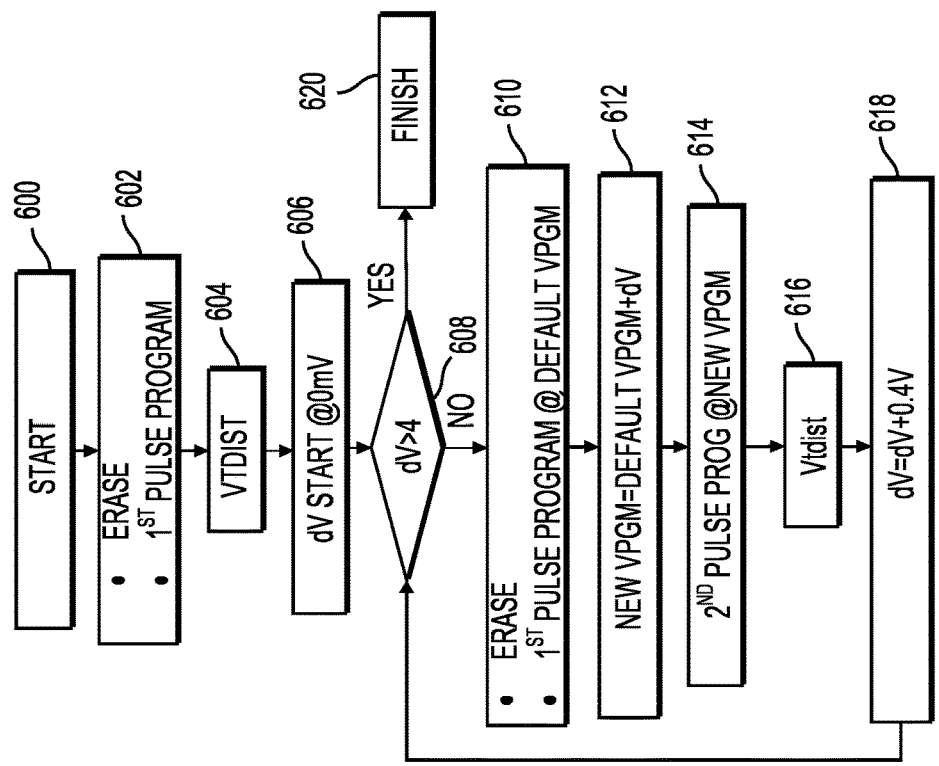
FIG. 14B
FIG. 14A

MEMORY APPARATUS AND METHOD OF OPERATION USING ONE PULSE SMART VERIFY

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Some non-volatile memory utilizes a floating gate that is positioned above and insulated from a channel region in a semiconductor substrate. The floating gate is positioned between the source and drain regions. A control gate is provided over and insulated from the floating gate. The threshold voltage of the transistor is controlled by the cycling condition amount of charge that is retained on the floating gate. That is, the minimum amount of voltage that must be applied to the control gate before the transistor is turned on to permit conduction between its source and drain is controlled by the level of charge on the floating gate.

Some non-volatile memory utilizes a charge trapping layer to store information. One such example has an oxide-nitride-oxide (ONO) region, in which the nitride (e.g., SiN) serves as a charge trapping layer to store information. When such a memory cell is programmed, electrons are stored in the charge trapping layer.

Non-volatile memory could have a 2D architecture or a 3D architecture. Ultra high density storage devices have been employed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. The conductor layers may function as word lines. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. The pipe connection may be made of undoped polysilicon. A back gate may surround the pipe connection to control conduction of the pipe connection. Control gates of the memory cells are provided by the conductor layers.

Prior to programming certain non-volatile memory devices, such as a NAND flash memory device, the memory cells are typically erased. The erase operation removes electrons from the floating gate, for some devices. For other devices, the erase operation removes electrons from the charge trapping layer. After erasing, it is necessary to determine a program voltage to be used to program the memory cells in a program operation. As the memory cells are repeatedly programmed and erased, the program voltage used may need to be adjusted accordingly.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide an apparatus including a block of memory cells. Each of the memory cells is connected to one of a plurality of word lines. The memory cells are also arranged in strings and are configured to retain a threshold voltage within a common range of threshold voltages defining a threshold window. A control circuit is coupled to the plurality of word lines and the strings. The control circuit is configured to determine a program lower tail voltage of a distribution of the threshold voltage of the memory cells following a first program pulse of a program operation having a first program voltage. The program lower tail voltage corresponds to a cycling condition of the memory cells. The control circuit calculates a second program voltage of a second program pulse of the program operation based on the program lower tail voltage and applies the second program pulse to each of selected ones of the plurality of word lines associated with the memory cells to program the memory cells such that the distribution of the threshold voltage of the memory cells have a desired program lower tail voltage without further program pulses.

According to another aspect of the disclosure a controller in communication with a memory apparatus including a block of memory cells. Each of the memory cells is connected to one of a plurality of word lines. The memory cells are arranged in strings and are configured to retain a threshold voltage within a common range of threshold voltages defining a threshold window. The controller is configured to determine a program lower tail voltage of a distribution of the threshold voltage of the memory cells following a first program pulse of a program operation having a first program voltage. The program lower tail voltage corresponds to a cycling condition of the memory cells. The controller then calculates a second program voltage of a second program pulse of the program operation based on the program lower tail voltage. The controller instructs the memory apparatus to apply the second program pulse to each of selected ones of the plurality of word lines associated with the memory cells to program the memory cells such that the distribution of the threshold voltage of the memory cells have a desired program lower tail voltage without further program pulses.

According to an additional aspect of the disclosure a method of operating a memory apparatus is provided. The memory apparatus includes a block of memory cells. Each of the memory cells is connected to one of a plurality of word lines. The memory cells are arranged in strings and are configured to retain a threshold voltage within a common range of threshold voltages defining a threshold window. The method includes the step of determining a program lower tail voltage of a distribution of the threshold voltage of the memory cells following a first program pulse of a program operation having a first program voltage, the program lower tail voltage corresponding to a cycling condition of the memory cells. The method continues with the step of calculating a second program voltage of a second program pulse of the program operation based on the program lower tail voltage and apply to each of selected ones of the plurality of word lines associated with the memory cells to program the memory cells such that the distribution of the threshold voltage of the memory cells have a desired program lower tail voltage without further program pulses.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 12A-12C illustrate example cumulative distribution function voltage plots of example memory cells during the one-pulse verify according to aspects of the disclosure;

FIG. 13 is a table illustrating a comparison between one-pulse smart verify, zero-pulse smart verify, and smart verify operations according to aspects of the disclosure;

FIG. 14A illustrates steps of an exemplary method of measuring program slope of the memory cells according to aspects of the disclosure;

FIG. 14B shows that program slope does not vary with cycling or starting program voltage according to aspects of the disclosure;

DETAILED DESCRIPTION

Figure 1A:
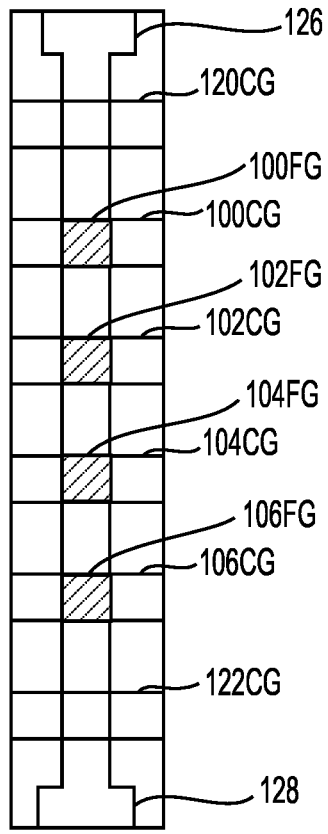
FIG. 1A is a top view of a NAND string according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory cells can include data memory cells, which are eligible to store user data, and dummy or non-data memory cells which are ineligible to store user data.

Before programming certain non-volatile memory devices, the memory cells are typically erased. For some devices, the erase operation removes electrons from the floating gate of the memory cell being erased. Alternatively, the erase operation removes electrons from the charge trapping layer.

During a program operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming pulses until the programming is completed. Next, a second word line, WL1, is programmed using one or more programming pulses until the programming is completed, and so forth. A programming pulse may include a set of increasing program voltages which are applied to the word line in respective program loops or program-verify iterations. Verify operations or stages may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state (see FIG. 7).

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the threshold voltage Vt or Vth of the memory cell exceeds the read voltage. The read voltages are set at levels which are expected to be between the threshold voltage levels of adjacent data states.

As the program voltage is applied to the word lines associated with the memory cells being programmed during the program operation, it is necessary to determine a program voltage VPGM to be used to program the memory cells in a program operation (voltage applied to the corresponding word lines). The program voltage utilized may need to be adjusted as the memory cells are cycled (i.e., repeatedly programmed and erased). One approach to determining the program voltage is to utilize 2 or 3 pulses of the program voltage followed by reading or verifying the threshold voltage of the selected memory cells (such an approach may be known as "smart verify"). Nevertheless, applying two, three, ore more pulses to determine the correct program voltage can significantly impact the speed of the program operation.

Figure 1B:
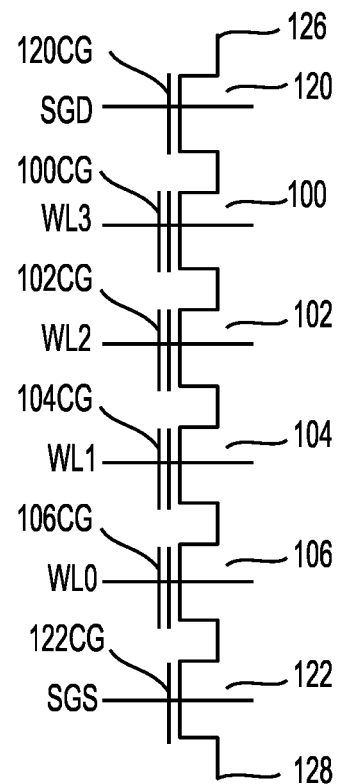
FIG. 1B is an equivalent circuit diagram of the NAND string of FIG. 1A according to aspects of the disclosure.

Techniques disclosed herein may be applied to 3D NAND, but are not necessarily limited thereto. A NAND flash memory structure may arrange multiple transistors in series between two select gates. The transistors in series and the select gates are referred to as a NAND string. FIG. 1A is a top view showing one NAND string. FIG. 1B is an equivalent circuit thereof. The NAND string depicted in FIGS. 1A and 1B includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 2:
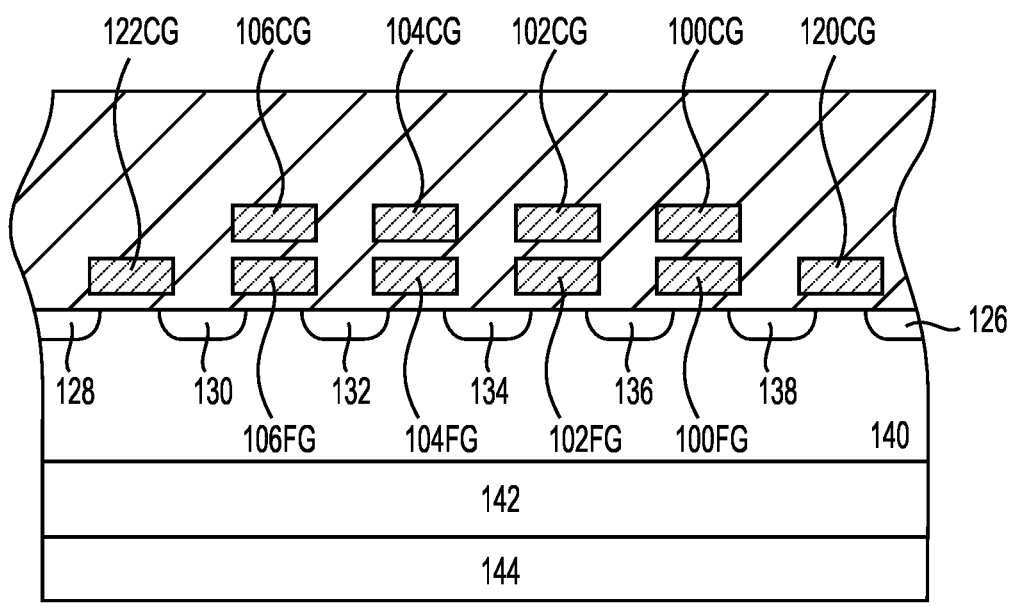
FIG. 2 is a cross-sectional view of the NAND string of FIG. 1A according to aspects of the disclosure.

FIG. 2 provides a cross-sectional view of one embodiment of the NAND string described above. FIG. 2 is for a 2D NAND string formed in a substrate. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1A-2 show four memory cells in the NAND string, the use of four transistors is provided only as an example. A NAND string used with the technology described herein can have less than four memory cells or more than four memory cells. For example, some NAND strings will include 8, 16, 32, 64 or more memory cells.

Each memory cell can store data represented in analog or digital form. When storing one bit of digital data, the range of possible threshold voltages of the memory cell is divided into two ranges, which are assigned logical data "1" and "0" (see e.g., FIG. 7). In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0V to the control gate, the memory cell will turn on to indicate logic one is being stored. When the threshold voltage is positive and a read operation is attempted by applying 0V to the control gate, the memory cell will not turn on, which indicates that logic zero is stored.

Other types of non-volatile memory in addition to NAND flash memory can also be used with the present technology.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 3:
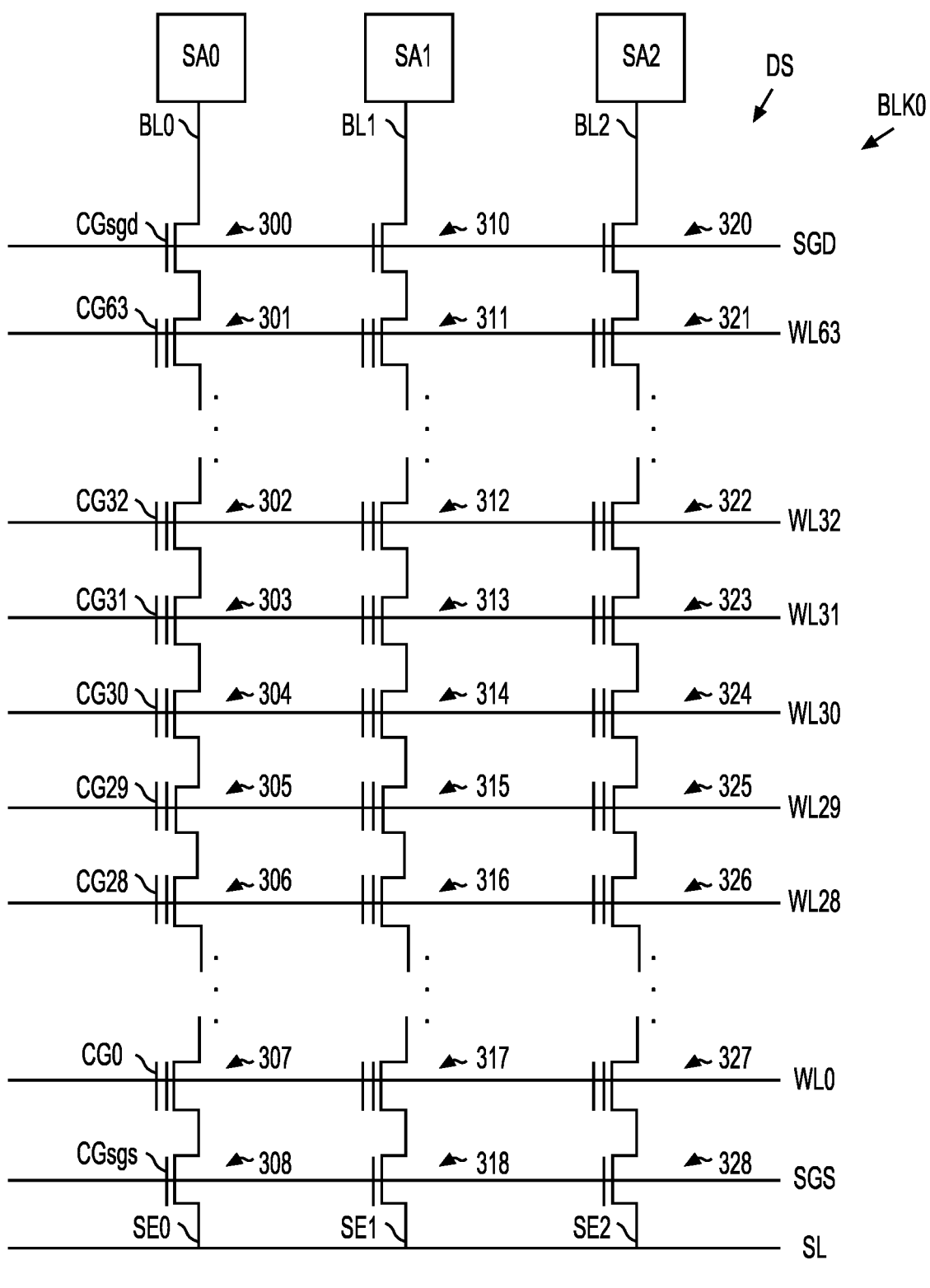
FIG. 3 depicts three example NAND strings such as shown in FIGS. 1A-2 in a block BLK0 according to aspects of the disclosure.

FIG. 3 depicts three example NAND strings such as shown in FIGS. 1A-2 in a block BLK0. BLK0 includes a number of NAND strings NS0, NS1, NS2, . . . and respective bit lines, e.g., BL0, BL1, BL2 . . . in communication with respective sense amplifiers SA0, SA1, SA2, . . . BLK0 comprises a set of non-volatile storage elements. Each NAND string is connected at one end to a select gate, drain (SGD) transistor, and the control gates of the SGD transistors are connected via a common SGD line. The NAND strings are connected at their other end to a select gate, source (SGS) transistor which, in turn, is connected to a common source line (SL). A number of word lines WL0-WL63 extend between the SGS and SGD transistors. WL0 is an edge word line which is adjacent to the source side (SS) of the block and WL63 is an edge word line which is adjacent to the drain side (DS) of the block.

An example NAND string NS0 includes storage elements 301, . . . , 302-306, . . . , 307 with respective control gates CG63, . . . CG32-CG28, . . . CG0, an SGS transistor 308 with a control gate CGsgs and a SGD transistor 300 with a control gate CGsgd. Another example NAND string NS1 includes storage elements 311, . . . , 312-316, . . . , 317, an SGS transistor 318 and a SGD transistor 310. Another example NAND string NS2 includes storage elements 321, . . . , 322-326, . . . , 327, an SGS transistor 328 and a SGD transistor 320. The NAND strings NS0, NS2, . . . are even numbered, and the NAND strings NS1, NS3 (not shown), . . . are odd numbered. Similarly, the bit lines BL0, BL2, . . . are even numbered, and the NAND strings BL1, BL3 (not shown), . . . are odd numbered. The storage elements can store user data and/or non-user data.

Figure 4:
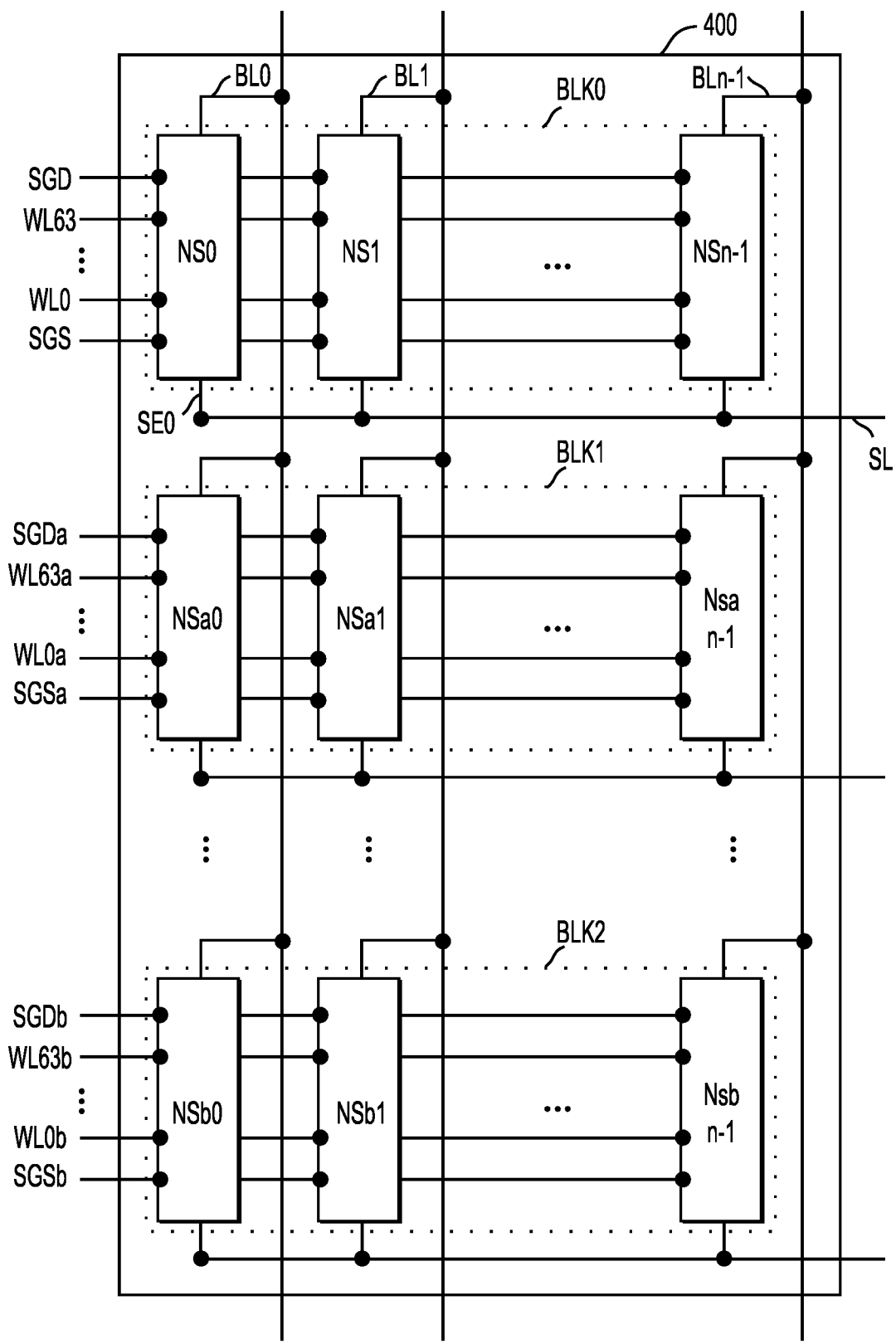
FIG. 4 is a block diagram of an array 400 of NAND flash memory cells including BLK0 of FIG. 3 and additional blocks BLK1 and BLK2 according to aspects of the disclosure.

FIG. 4 is a block diagram of an array 400 of NAND flash memory cells including BLK0 of FIG. 3 and additional blocks BLK1 and BLK2. Along each column, a bit line (BL) is coupled to the drain terminal of the drain select gate for the NAND string. Along each row of NAND strings, a source line (SL) may connect all the source terminals of the source select gates of the NAND strings (e.g., at SE0 of NS0).

The array of storage elements is divided into a large number of blocks (e.g., BLK0-BLK2) of storage elements, where each block includes a set of one or more NAND strings in communication with a common set of word lines, SGS line and SGD line. Each NAND string is also in communication with a respective bit line. For example, BLK0 includes NAND strings NS0, NS1, . . . , NSn-1 in communication with BL0, BL1, . . . BLn-1, respectively, and with WL0-WL63 SGS and SGD. BLK1 includes NAND strings NSa0, NSa1, . . . , NSan-1 in communication with BL0, BL1, . . . BLn-1, respectively, and with WL0 a-WL63 a, SGSa and SGDa. BLK2 includes NAND strings NSb0, NSb1, . . . , NSbn-1 in communication with BL0, BL1, BLn-1, respectively, and with WL0 b-WL63 b, SGSb and SGDb.

As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 15-20 V) for a sufficient period of time and grounding or applying a low bias, e.g., 1 V, on the word lines of a selected block while the source and bit lines are floating. Due to capacitive cross coupling ("cross" denotes coupling from neighboring storage elements), the bit lines, select lines, and common source are also raised to a significant fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells. In one embodiment, 3D NAND is erased using a different technique. 3D NAND will be further discussed below.

Figure 5A:
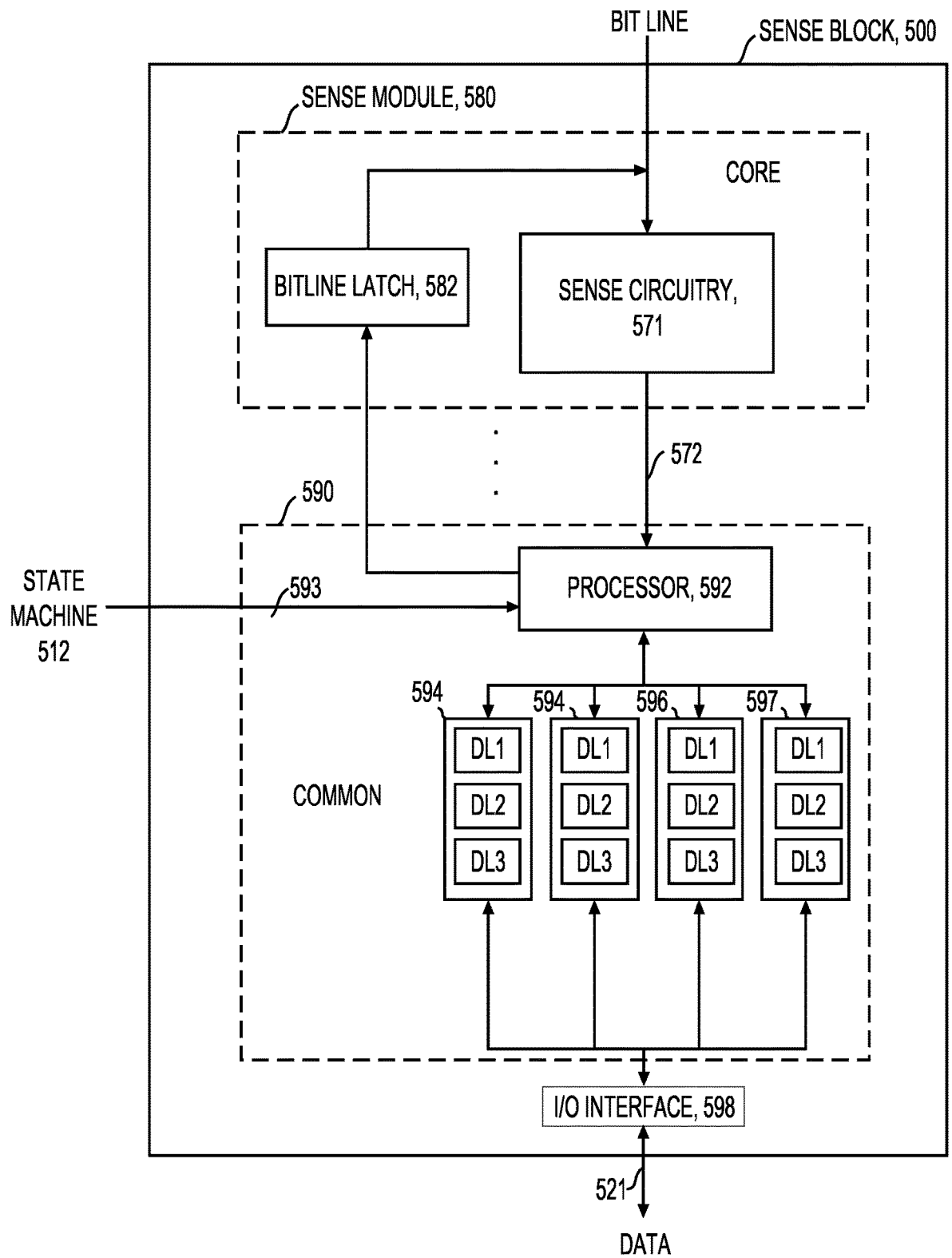
FIG. 5A is a block diagram depicting one embodiment of a sense block according to aspects of the disclosure.

FIG. 5A is a block diagram depicting one embodiment of a sense block 500. An individual sense block 500 is partitioned into a core portion, referred to as a sense module 580, and a common portion 590. In one embodiment, there is a separate sense module 580 for each bit line and one common portion 590 for a set of multiple sense modules 580. In one example, a sense block 500 will include one common portion 590 and eight sense modules 580. Each of the sense modules in a group will communicate with the associated common portion via a data bus 572.

Sense module 580 comprises sense circuitry 571 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 will result in the connected bit line being pulled to a state designating program inhibit (e.g., 1.5-3 V). As an example, a flag=0 can inhibit programming, while flag=1 does not inhibit programming.

Common portion 590 comprises a processor 592, three example sets of data latches 594 and an I/O Interface 598 coupled between the sets of data latches 594 and data bus 521. One set of data latches can be provided for each sense module, and three data latches identified by DL1, DL2, and DL3 may be provided for each set. The use of the data latches is further discussed below.

Processor 592 performs computations. For example, one of its functions is to determine the data stored in the sensed storage element and store the determined data in the set of data latches. At least some of the data latches in a set of data latches (e.g., 594) are used to store data bits determined by processor 592 during a read operation. At least some of the data latches in a set of data latches are also used to store data bits imported from the data bus 521 during a program operation. The imported data bits represent write data meant to be programmed into the memory. I/O interface 598 provides an interface between data latches 594-697 and the data bus 521.

In one embodiment, data is stored in the DL1 and DL2 latches at the beginning of the program operation. For example, lower page data may be stored in DL1 and upper page data may be stored in DL2. In one embodiment, lower page data that is read from memory cells during an IDL is stored in the DL1 latches. DL3 may be used to store verify status, such as lockout status during programming. For example, when a memory cell's Vt has been verified a reaching its target level, the DL3 latch can be set to indicate this such that further programming of the memory cell may be inhibited. Note this describes programming two bits per memory cell. In one embodiment, during a read operation, the DL1 and DL2 latches are used to store the two bits that are read from the memory cell. Note that there may be more than two bits per memory cell. There can be one additional latch for each additional bit to be stored per memory cell.

During reading or other sensing, the state machine 512 controls the supply of different control gate voltages to the addressed storage element. As it steps through the various control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches (e.g., 594). In another embodiment of the core portion, bit line latch 582 serves both as a latch for latching the output of the sense module 580 and as a bit line latch as described above.

Some implementations can include multiple processors 592. In one embodiment, each processor 592 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 592 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 594-597 from the data bus 521. The program operation, under the control of the state machine, comprises a series of programming voltage pulses applied to the control gates of the addressed storage elements. Each program pulse is followed by a read back (verify) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit. This inhibits the storage element coupled to the bit line from further programming even if program pulses appear on its control gate. In other embodiments, the processor initially loads the bit line latch 582 and the sense circuitry sets it to an inhibit value during the verify process.

Each set of data latch stacks 594-597 contains a stack of data latches corresponding to the sense module 580, in one embodiment. In one embodiment, there are three data latches per sense module 580. All the DL1 and DL2 data latches corresponding to the read/write block of m storage elements can be linked together to form a block shift register so that a block of data can be input or output by serial transfer.

In one embodiment, one purpose of the DL1 and DL2 latches is to store data that is to be programmed into a storage element. For example, the storage elements may store two bits per storage element. In one embodiment, lower page data is initially stored into the DL1 latches and upper page data is initially stored into the DL2 latches.

In one embodiment, the storage elements store three bits per storage element. In this case, there may be an additional data latch (not depicted in FIG. 5A) for initially storing the third bit of data that is to be programmed into a storage element. In one embodiment, the storage elements four bits per storage element, in which there may be two additional data latches (not depicted in FIG. 5A) for initially storing the third and fourth bits of data that is to be programmed into a storage element. The storage elements could store more than four bits per storage element, in which case there may be one data latch for each bit.

Additional information about the read operations and sense amplifiers can be found in (1) U.S. Pat. No. 7,196,931, "Non-Volatile Memory and Method with Reduced Source Line Bias Errors,"; (2) U.S. Pat. No. 7,023,736, "Non-Volatile Memory and Method with Improved Sensing,"; (3) U.S. Pat. No. 7,046,568, "Memory Sensing Circuit and Method for Low Voltage Operation"; (4) U.S. Pat. No. 7,196,928, "Compensating for Coupling during Read Operations of Non-Volatile Memory," and (5) U.S. Pat. No. 7,327,619, "Reference Sense Amplifier for Non-Volatile Memory". All five of the immediately above-listed patent documents are incorporated herein by reference in their entirety.

Figure 5B:
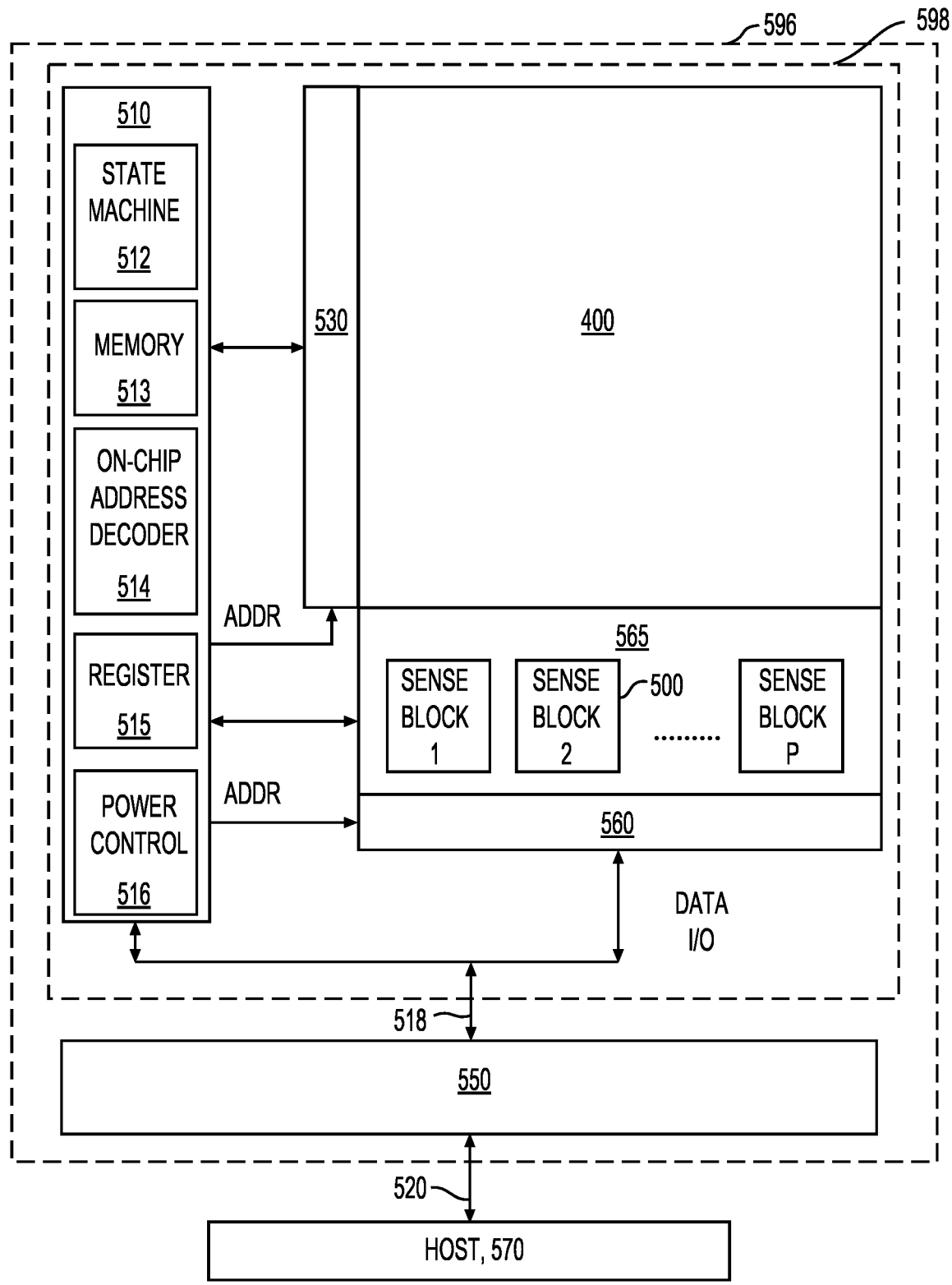
FIG. 5B is a block diagram of a non-volatile memory system which includes the array 400 of FIG. 4 according to aspects of the disclosure.

FIG. 5B is a block diagram of a non-volatile memory system which includes the array 400 of FIG. 4. The memory array 400 could include a 2D architecture or a 3D architecture. One example of a 3D architecture is a BiCS architecture. A 3D architecture may include 3D vertical NAND strings. The memory cells in 3D vertical NAND strings may include an ONO layer to store information. The information may be stored in a charge trapping layer such as, but not limited to, SiN. Note that an ONO layer can be used to store information for both 2D and 2D NAND, as well as other architectures. Thus, a floating gate may be used to store information, but is not required.

The non-volatile memory system comprises a memory device 596 having read/write circuits for reading and programming a page of memory cells in parallel, according to one embodiment of the present technology. Memory device 596 may include one or more memory die 598. Memory die 598 includes a two-dimensional array of memory cells 400, control circuitry 510, and read/write circuits 565. The memory array 400 is addressable by word lines via a row decoder 530 and by bit lines via a column decoder 560. The read/write circuits 565 include multiple sense blocks 500 and allow a page of memory cells to be read or programmed in parallel. Typically a controller 550 is included in the same memory device 596 (e.g., a removable storage card) as the one or more memory die 598. Commands and Data are transferred between the host 570 and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, a memory 513, an on-chip address decoder 514, a register 515 and a power control module 516. The state machine 512 provides chip-level control of memory operations. The memory 513 can store original write data, modified write data and status bits for use by the state machine 512. The on-chip address decoder 514 provides an address interface between that used by the host or a memory controller to the hardware address used by the decoders 530 and 560. The register 515 can be used to record voltages used when programming or erasing the memory device 596. The power control module 516 controls the power and voltages supplied to the word lines and bit lines during memory operations. In another approach, dual row/column decoders and read/write circuits are used. A control circuit can be considered to comprise one or more of the components 510, 512, 513, 514, 515, 516, 530, 550, 560, 565, for instance.

Figure 6:
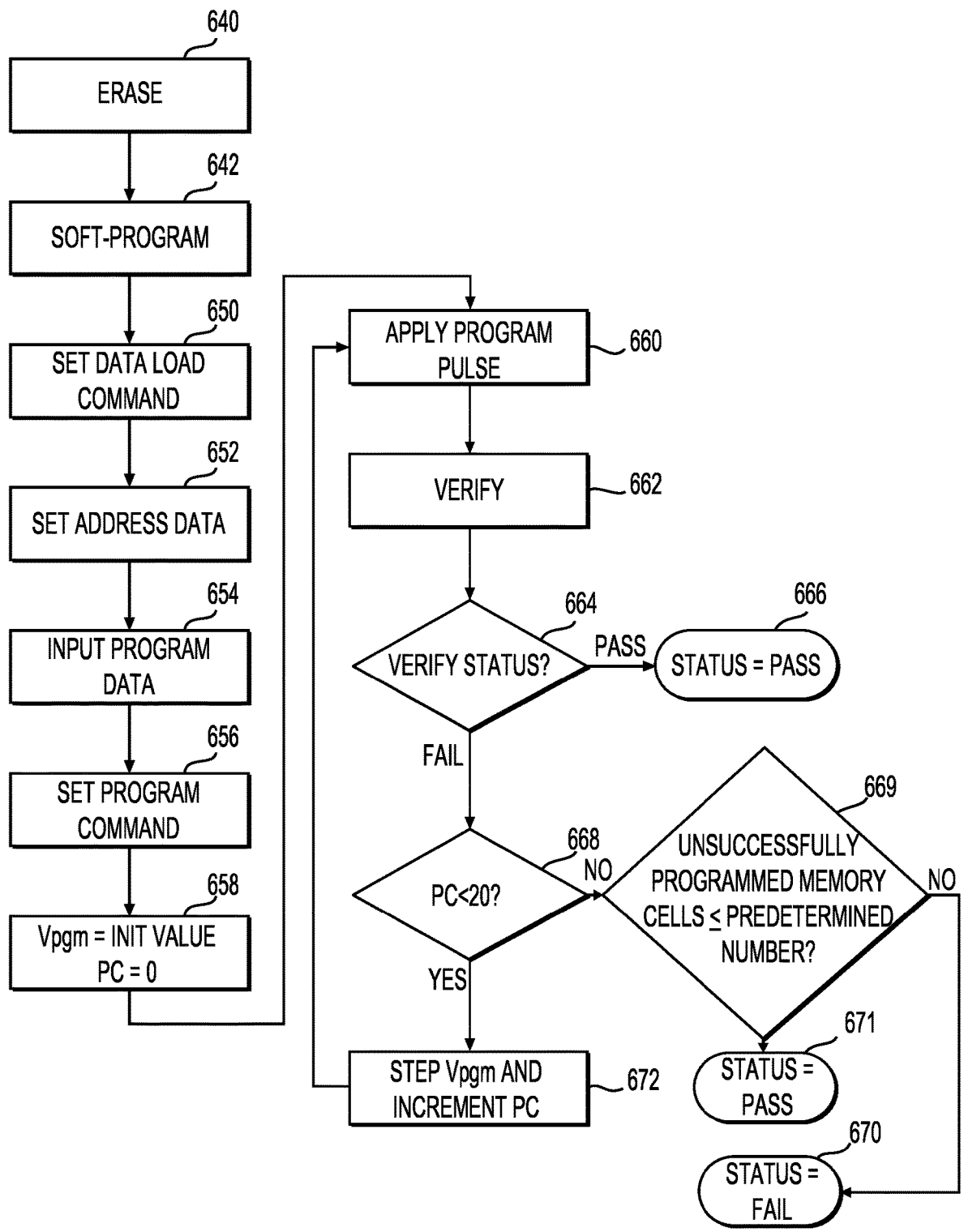
FIG. 6 is a flow chart describing one embodiment of a method for programming non-volatile memory according to aspects of the disclosure.

FIG. 6 is a flow chart describing one embodiment of a method for programming non-volatile memory. The memory cells to be programmed are erased at step 640. Step 640 can include erasing more memory cells than those to be programmed (e.g., in blocks or other units). At step 642, soft-programming is performed to narrow the distribution of erased threshold voltages for the erased memory cells. Some memory cells may be in a deeper erased state than necessary as a result of the erase process. Soft-programming can apply small programming pulses to move the threshold voltage of the erased memory cells closer to the erase verify level. At step 650 of FIG. 6, a "data load" command is issued by controller 550 and input to command circuits, allowing data to be input to data input/output buffer. At step 652, address data designating the page address is input to row controller or decoder 514 from the controller or host. The input data is recognized as the page address and latched via state machine 512, affected by the address latch signal input to command circuits. At step 654, a page of program data for the addressed page is input to data input/output buffer for programming. For example, 512 bytes of data could be input in one embodiment. That data is latched in the appropriate registers for the selected bit lines. In some embodiments, the data is also latched in a second register for the selected bit lines to be used for verify operations. At step 656, a "program" command is issued by the controller and input to data input/output buffer. The command is latched by state machine 512 via the command latch signal input to command circuits.

Triggered by the "program" command, the data latched in step 654 will be programmed into the selected memory cells controlled by state machine 512 using stepped pulses applied to the appropriate word line. At step 658, Vpgm or VPGM, the programming pulse voltage level applied to the selected word line, is initialized to the starting pulse (e.g., 12V) and a program counter PC maintained by state machine 512 is initialized at 0. At step 660, the first Vpgm pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to VDD to inhibit programming.

At step 662, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 664, it is checked whether all of the data latches are storing logic "1." If so, the programming process is complete and successful because all selected memory cells were programmed and verified to their target states. A status of "PASS" is reported at step 666.

If, at step 664, it is determined that not all of the data latches are storing logic "1," then the programming process continues. At step 668, the program counter PC is checked against a program limit value. One example of a program limit value is 20, however, other values can be used in various implementations. If the program counter PC is not less than 20, then it is determined at step 669 whether the number of bits that have not been successfully programmed is equal to or less than a predetermined number. If the number of unsuccessfully programmed bits is equal to or less than the predetermined number, then the programming process is flagged as passed and a status of pass is reported at step 671. The bits that are not successfully programmed can be corrected using error correction during the read process. If however, the number of unsuccessfully programmed bits is greater than the predetermined number, the program process is flagged as failed and a status of fail is reported at step 670. If the program counter PC is less than 20, then the Vpgm level is increased by the step size and the program counter PC is incremented at step 672. After step 672, the process loops back to step 760 to apply the next Vpgm pulse.

The flowchart of FIG. 6 depicts a single-pass programming method as can be applied for binary storage. In a two-pass programming method as can be applied for multi-level storage, for example, multiple programming or verification steps may be used in a single iteration of the flowchart. Steps 658-672 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

At the end of a successful program process or operation, the threshold voltages of the memory cells should be within one or more distributions of threshold voltages for programmed memory cells or within a distribution of threshold voltages for erased memory cells.

Figure 7:
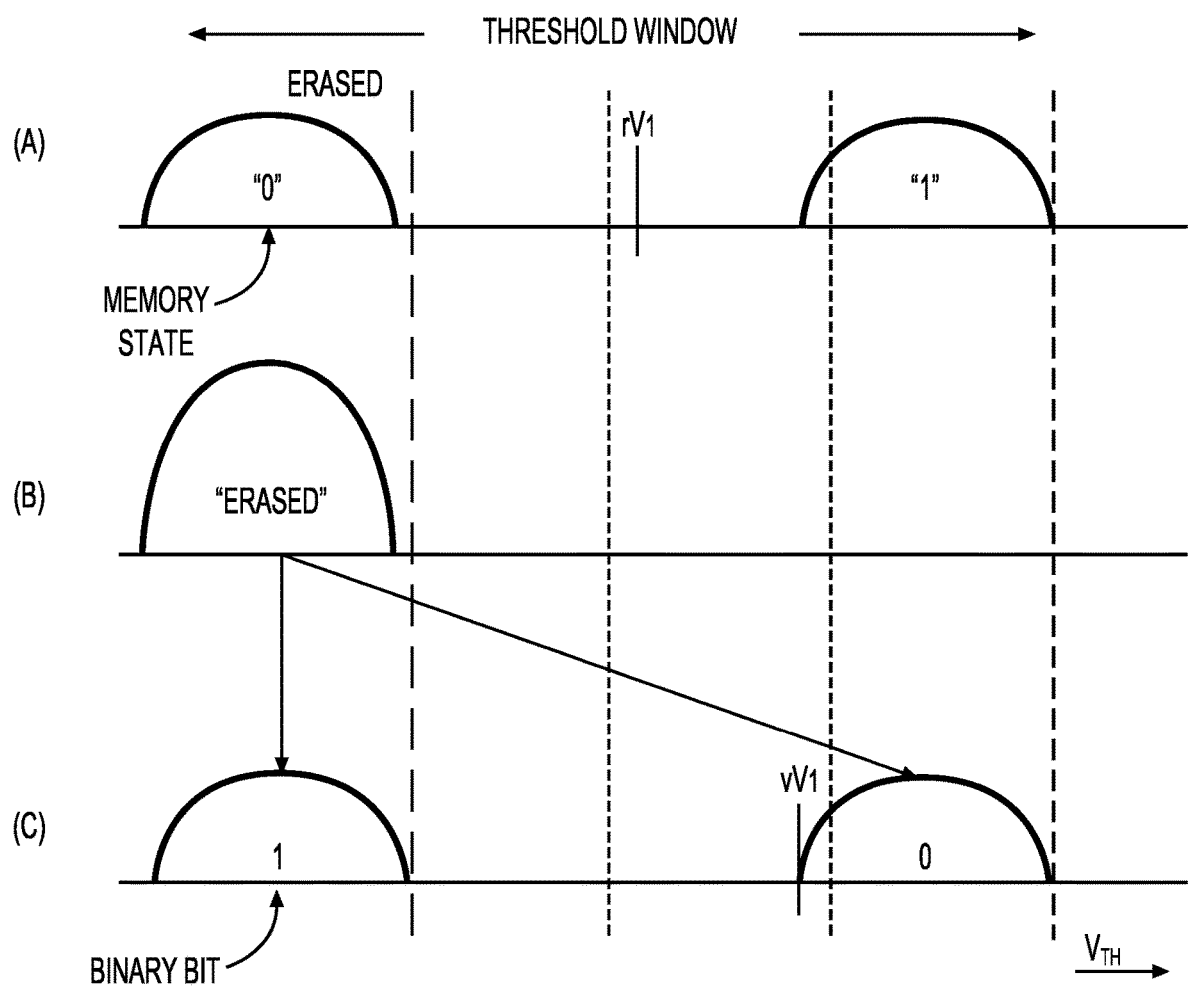
FIG. 7 illustrates a binary memory having a population of cells with each cell being in one of two possible states according to aspects of the disclosure.

FIG. 7 illustrates a binary memory having a population of cells with each cell being in one of two possible states. Each memory cell has its threshold window partitioned by a single demarcation level into two distinct zones. As shown in FIG. 7(a), during read, a read demarcation level rV1, between a lower zone and an upper zone, is used to determine to which zone the threshold level of the cell lies. The cell is in an "erased" state if its threshold is located in the lower zone and is in a "programmed" state if its threshold is located in the upper zone. FIG. 7(b) illustrates the memory initially has all its cells in the "erased" state. FIG. 7(c) illustrates some of cells being programmed to the "programmed" state. A 1-bit or binary code is used to code the memory states. For example, the bit value "1" represents the "erased" state and "0" represents the "programmed" state. Typically programming is performed by application of one or more programming voltage pulse. After each pulse, the cell is sensed to verify if the threshold has moved beyond a verify demarcation level vV1. A memory with such memory cell partitioning is referred to as "binary" memory or Single-level Cell ("SLC") memory. It will be seen that a binary or SLC memory operates with a wide margin of error as the entire threshold window is only occupied by two zones.

Simultaneous multi-threshold (SMT) sensing may also be employed. During SMT sensing, two or more different bias conditions may be used to simultaneously sense two different threshold voltages. For example, a single verify reference voltage may be applied to the selected word line, while one bias condition is used for memory cells being verified to a first state and a second bias condition is used for memory cells being verified to a second state. One example of different bias conditions is to sense the conduction current of the bit line for different lengths of times. Herein, this sense time is referred to as "FSENSE." Using two (or more) different FSENSEs allows different threshold voltages to be sensed, while applying the same verify reference voltage to the selected word line. Hence, this may be referred to as "simultaneous multi-threshold" sensing.

Using SMT sensing saves time during program verify. However, when the memory cells are later read, the bias condition that was used for each memory cell being read not be known. Therefore, all memory cells may be read using the same bias condition. For example, all memory cells may be read using a nominal (e.g., short) FSENSE. Therefore, the memory cells that were verified using a longer FSENSE would get read using a different FSENSE than was used at verify.

Note that memory cells can react differently to being read using a different bias condition than used during verify. For example, they may show different threshold voltage shifts. Ideally, all memory cells would experience the same threshold voltage shift as a result of the different bias conditions (e.g., sensing times). However, this may not be the case. The foregoing may lead to variance in the threshold voltage shifts of memory cells read with a different bias condition than used to verify.

As previously discussed, while it is possible to use at least two or three program pulses to determine the correct program voltage (VPGM) level, such a solution may not be ideal. Specifically, using multiple program pulses to determine the program voltage that should be used can cause the program operation to be slower than if multiple program pulses were not required. Additionally, if frequent block jumps are required, re-acquiring the program voltage level will also slow down associated programming operations.

Consequently, described herein is a memory apparatus (e.g., memory device 596 in FIG. 5B) including a block (e.g., BLK0 in FIG. 3) of storage elements or memory cells (e.g., storage elements 301, . . . , 302-306, . . . , 307 in FIG. 3) with each of the memory cells connected to one of a plurality of word lines (e.g., WL0-WL63 in FIG. 3). The plurality of word lines can be grouped in word line zones (i.e., groups of word lines). The memory cells are arranged in strings (e.g., strings NS0, NS1, . . . , NSn−1 in FIG. 3) and each is configured to retain a threshold voltage Vt or Vth within a common range of threshold voltages defining a threshold window. According to an aspect, the memory cells included in the apparatus are SLC. The apparatus also includes a control circuit (e.g., components 510, 512, 513, 514, 515, 516, 530, 550, 560, 565 in FIG. 5B) coupled to the plurality of word lines and the strings and implements a process known as "one-pulse smart verify" (1PSV).

In operation, the control circuit can determine whether the at least one of the selected ones of the plurality of word lines associated with the memory cells is a first logical word line of a zone in a first string of the strings in response to determining there has not been a block jump. The control circuit begins a program operation (described in more detail below) in response to determining there has been a block jump or determining that the at least one of the selected ones of the plurality of word lines associated with the memory cells is the first logical word line of the zone in the first string of the strings. During the program operation, the control circuit is configured to determine a program lower tail voltage of a distribution of the threshold voltage of the memory cells following a first program pulse of the program operation having a first program voltage (e.g., VPGMSLC). So, prior to determining the program lower tail voltage, the first pulse program is applied to a first logical word line of a word line zone for memory cells that need to be programmed in a first string Str0 (e.g., NS0 of FIG. 3) using the first program voltage VPGMSLC.

The program lower tail voltage or lower tail Vt is a point near a lower end of the threshold voltage Vt distribution of programmed memory cells (e.g., close to the verify demarcation level vV1 shown in FIG. 7(c)). The lower tail voltage may be defined based on ignoring a certain number of outlying Vts. For example, if about 31 memory cells have Vts to the left of the lower tail Vt, the lower tail Vt can be defined based on any number other than 31. If counting is performed on a NAND string basis, then a certain number of NAND strings are ignored. As an example, NAND strings are examined to determine whether a given NAND string has at least one memory cell with a Vt above a read reference voltage. Note that there may be about 75,000 NAND strings or more in the block. The lower tail Vt may also be defined based on statistics. For example, if the Vt distribution is characterized by a mean and a standard deviation, then the lower tail Vt may be defined as a certain real number of standard deviations above the mean. The program lower tail voltage corresponds to a cycling condition of the memory cells.

Figure 8:
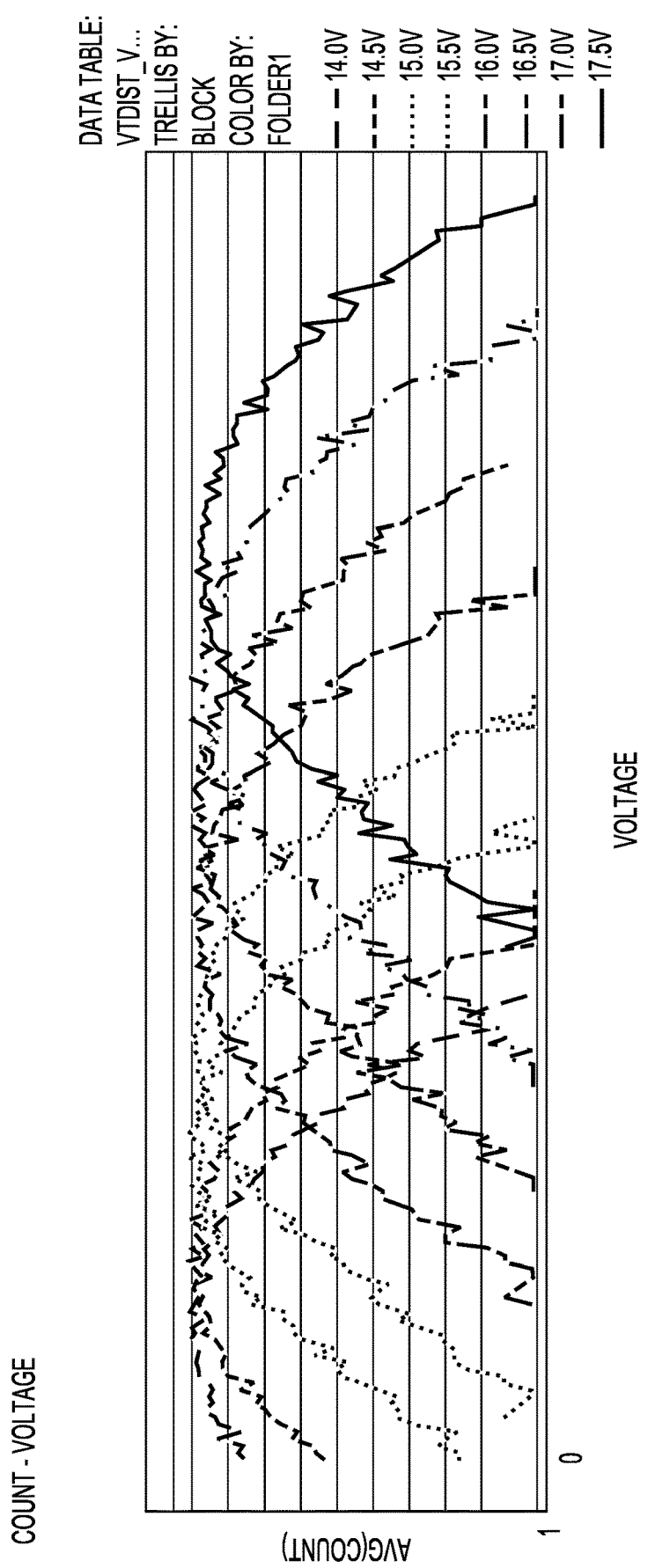
FIG. 8 shows distributions of the memory cells after applying varying first program voltages according to aspects of the disclosure.

According to an aspect, the first program voltage VPGMSLC can be trimmed so that the NVT lower tail position is 1.4V lower (−28DAC) than a desired program lower tail position or voltage at a regular sense time FSENSE (FSENSE #2). Thus, the control circuit may be configured to select the first program voltage so that the program lower tail voltage is a predetermined spacing voltage lower (e.g., 1.4 volts) than desired program lower tail voltage. FIG. 8 shows distributions of the memory cells after applying varying first program voltages VPGMSLC. The first program voltage VPGMSLC can also be trimmed by die for the memory cells to make sure lower tail is >0 volts to be detectable. As shown in the example data, the lower tail can be visibly seen and calculated starting at 15.5 volts. It is therefore recommended to use >16.0 volts as the starting first pulse program voltage VPGM for SLC (VPGMSLC). Nevertheless, other magnitudes of the first program voltage may be used instead.

Figures 9, 11:
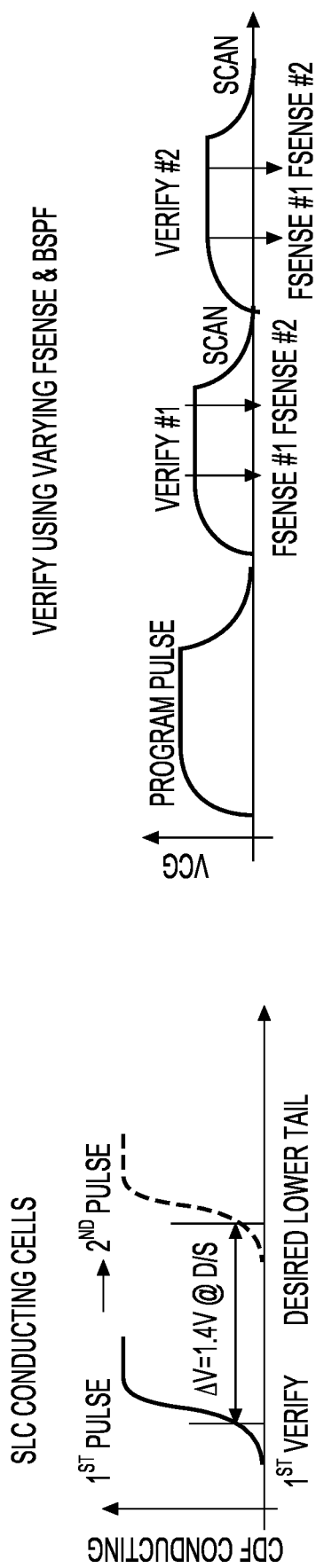
FIG. 9 shows a cumulative distribution function of conducting memory cells after a first program pulse and then after a second program pulse according to aspects of the disclosure.
FIG. 11 shows a program operation including the first program pulse and a first verify operation and a second verify operation according to aspects of the disclosure.

The control circuit is also configured to calculate a second program voltage of a second program pulse of the program operation based on the program lower tail voltage. The control circuit then applies the second program pulse to each of selected ones of the plurality of word lines associated with the memory cells to program the memory cells such that the distribution of the threshold voltage of the memory cells have the desired program lower tail voltage without further program pulses. FIG. 9 shows a cumulative distribution function (CDF) of conducting memory cells after the first program pulse and then after the second program pulse. As shown, the threshold voltage of the memory cells is shifted approximately 1.4 volts from the distribution of the memory cells after the first program pulse to the desired program lower tail voltage.

According to an aspect, the control circuit applies at least one verify voltage pulse to at least one of the selected ones of the plurality of word lines associated with the memory cells while sensing whether a selected one of the strings conducts current. The control circuit is configured to count at least one conducting quantity of the memory cells of the selected one of the strings conducting current during at least one verify operation following the first program pulse. The control circuit determines the program lower tail voltage based on a comparison of the at least one conducting quantity of the memory cells of the selected one of the strings conducting current during the at least one verify operation to one of a plurality of conducting quantity thresholds (e.g., BSPF_1PSV_1_SLC, BSPF_1PSV_2_SLC, BSPF_1PSV_3_SLC, or BSPF_1PSV_4_SLC). So, one-pulse smart verify ensures that only one program pulse is needed to determine the program lower tail position or voltage.

Figure 10:
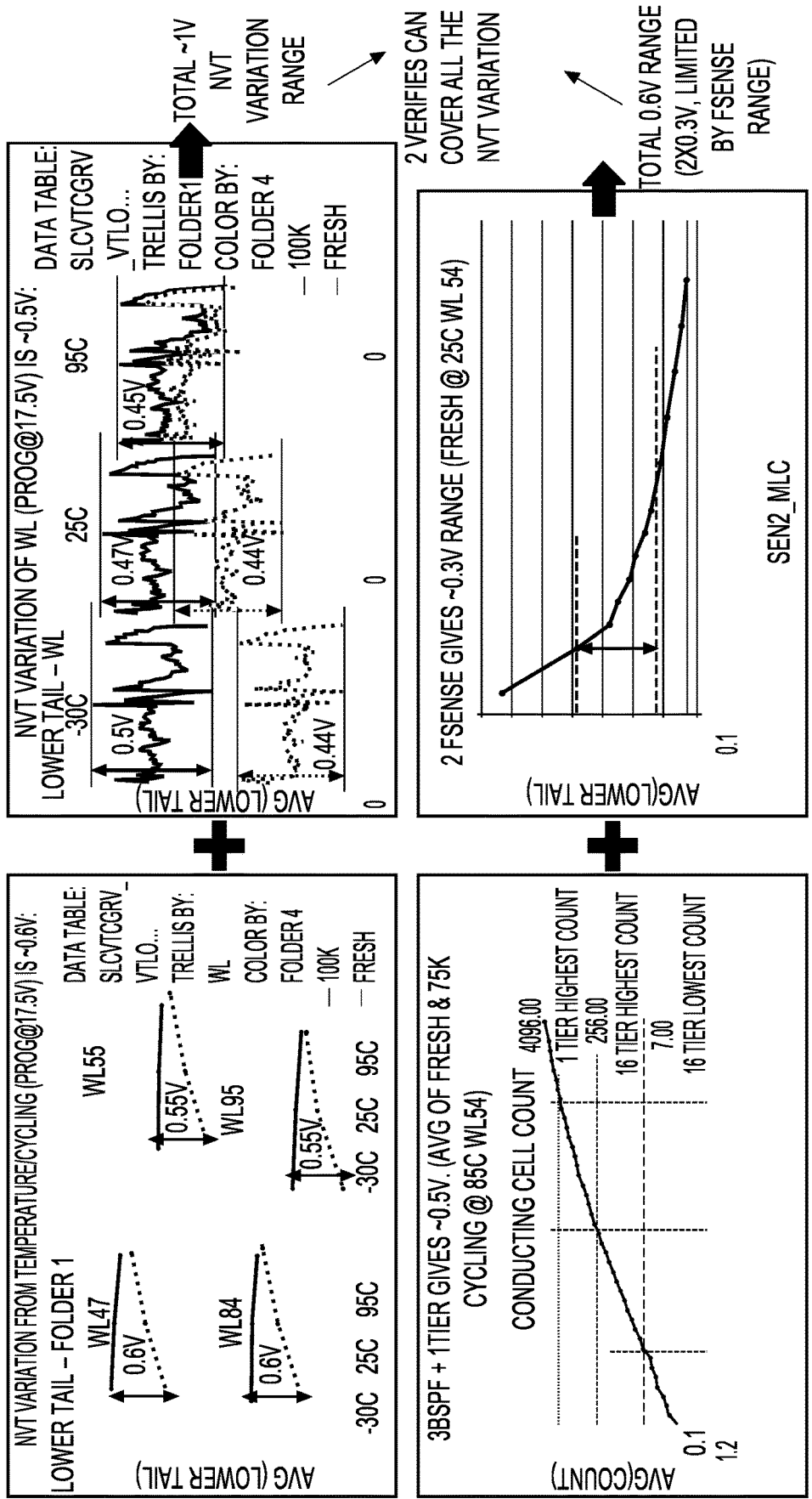
FIG. 10 shows testing data for the memory apparatus showing that one or two verify operations can cover all variations due to word line position, temperature and cycling according to aspects of the disclosure.

FIG. 10 shows testing data for the memory apparatus showing that one or two verify operations can cover all variations due to word line position, temperature and cycling. Specifically, the testing data includes threshold voltage variation from temperature or cycling for various word lines (upper left hand corner of FIG. 10), threshold voltage variations of the memory cells programmed at a specific voltage (e.g., 17.5 volts) (upper right hand corner of FIG. 10), a conducting cell count for three conducting quantity thresholds (e.g., BSPF_1PSV_1_SLC, BSPF_1PSV_2_SLC, and BSPF_1PSV_3_SLC) for various amounts of tiers (lower left hand corner of FIG. 10), and lower tail voltages for two sense times (lower right hand corner of FIG. 10).

Referring to FIG. 11, the first program pulse is indicated as "Program pulse" and the at least one verify operation includes a first verify operation and a second verify operation. The at least one conducting quantity includes a first conducting quantity associated with the first verify operation and a second conducting quantity associated with the second verify operation. The control circuit is further configured to apply a first verify pulse (Verify #1) of a first verify voltage to the at least one of the selected ones of the plurality of word lines associated with the memory cells in the first verify operation. The control circuit is also configured to sense whether the selected one of the strings conducts current while applying the first verify pulse after waiting each of a plurality of sense times and counting and saving the first conducting quantity of the memory cells of the selected one of the strings conducting current during the first verify operation (indicated as "Scan" following Verify #1). According to an aspect, the plurality of sense times can includes a first sense time FSENSE #2 and a second sense time FSENSE #1.

The control circuit recursively determines whether the first conducting quantity of the memory cells of the selected one of the strings conducting current is less than one of the plurality of conducting quantity thresholds (e.g., BSPF_1PSV_1_SLC, BSPF_1PSV_2_SLC, BSPF_1PSV_3_SLC, or BSPF_1PSV_4_SLC) during the first verify operation. So, the verify pulses are applied to determine lower tail position (conducting cell counts) for the memory cells using varying sense FSENSE times (e.g., FSENSE #1 and FSENSE #2) and varying bit scan pass fail (BSPF) criteria or the plurality of conducting quantity thresholds. For the remaining cases where the lower tail cannot be found by the first verify, a second verify might be required. Accordingly, the control circuit then adds one of a plurality of verify offset voltages (e.g., 0.5 volts or 0.55 volts) to the first verify voltage to determine a second verify voltage in response to the first conducting quantity of the memory cells of the selected one of the strings conducting current being less than all of the plurality of conducting quantity thresholds (e.g., BSPF_1PSV_1_SLC, BSPF_1PSV_2_SLC, BSPF_1PSV_3_SLC, and BSPF_1PSV_4_SLC) during the first verify operation. The control circuit is then configured to recursively determine whether the first conducting quantity of the memory cells of the selected one of the strings conducting current is greater than one of the plurality of conducting quantity thresholds (e.g., BSPF_1PSV_1_SLC, BSPF_1PSV_2_SLC, BSPF_1PSV_3_SLC, or BSPF_1PSV_4_SLC) during the first verify operation in response to the first conducting quantity of the memory cells of the selected one of the strings conducting current not being less than all of the plurality of conducting quantity thresholds (e.g., BSPF_1PSV_1_SLC, BSPF_1PSV_2_SLC, BSPF_1PSV_3_SLC, and BSPF_1PSV_4_SLC) during the first verify operation. The control circuit subtracts the one of the plurality of verify offset voltages (e.g., 0.5 volts or 0.55 volts) from the first verify voltage to determine the second verify voltage in response to the first conducting quantity of the memory cells of the selected one of the strings conducting current being greater than all of the plurality of conducting quantity thresholds (e.g., BSPF_1PSV_1_SLC, BSPF_1PSV_2_SLC, BSPF_1PSV_3_SLC, and BSPF_1PSV_4_SLC) during the first verify operation. So, the second verify level can be shifted by +/−0.55V (less resolution) or +/−0.5V (higher resolution).

Next, for the second verify operation, the control circuit is configured to apply a second verify pulse (Verify #2) of the second verify voltage to at least one of the selected ones of the plurality of word lines associated with the memory cells during the second verify operation. The control circuit is also configured to sense whether the selected one of the strings conducts current while applying the second verify pulse after waiting each of the plurality of sense times (e.g., FSENSE #1 and FSENSE #2) and count and save the second conducting quantity of the memory cells of the selected one of the strings conducting current during the second verify operation (indicated as "Scan" following Verify #2).

The control circuit then recursively determines whether the second conducting quantity of the memory cells of the selected one of the strings conducting current is less than one of the plurality of conducting quantity thresholds (e.g., BSPF_1PSV_1_SLC, BSPF_1PSV_2_SLC, BSPF_1PSV_3_SLC, or BSPF_1PSV_4_SLC) during the second verify operation. The control circuit also recursively determines whether the second conducting quantity of the memory cells of the selected one of the strings conducting current is greater than one of the plurality of conducting quantity thresholds (e.g., BSPF_1PSV_1_SLC, BSPF_1PSV_2_SLC, BSPF_1PSV_3_SLC, or BSPF_1PSV_4_SLC) during the second verify operation in response to the second conducting quantity of the memory cells of the selected one of the strings conducting current not being less than all of the plurality of conducting quantity thresholds (e.g., BSPF_1PSV_1_SLC, BSPF_1PSV_2_SLC, BSPF_1PSV_3_SLC, and BSPF_1PSV_4_SLC) during the first verify operation. So, a varying sense FSENSE time and varying BSPF is again applied to second verify.

The control circuit is configured to select one of a plurality of delta program voltages DVPGM based on the recursively determining whether at least one of the first conducting quantity and the second conducting quantity of the memory cells of the selected one of the strings conducting current is less or greater than the one of the plurality of conducting quantity thresholds (e.g., BSPF_1PSV_1_SLC, BSPF_1PSV_2_SLC, BSPF_1PSV_3_SLC, or BSPF_1PSV_4_SLC) during at least one of the first verify operation and the second verify operation in response to the second conducting quantity of the memory cells of the selected one of the strings conducting current not being greater than all of the plurality of conducting quantity thresholds (e.g., BSPF_1PSV_1_SLC, BSPF_1PSV_2_SLC, BSPF_1PSV_3_SLC, and BSPF_1PSV_4_SLC) during the first verify operation.

In addition, the control circuit is configured to add the one of the plurality of delta program voltages DVPGM to the first program voltage VPGMSLC to calculate the second program voltage (VPGMSLC+DVPGM) of the second program pulse in response to selecting the one of the plurality of delta program voltages DVPGM based on the recursively determining whether the at least one of the first conducting quantity and the second conducting quantity of the memory cells of the selected one of the strings conducting current is less or greater than the one of the plurality of conducting quantity thresholds (e.g., BSPF_1PSV_1_SLC, BSPF_1PSV_2_SLC, BSPF_1PSV_3_SLC, BSPF_1PSV_4_SLC) during the at least one of the first verify operation and the second verify operation.

After the verify operations, the control circuit applies the second program pulse having the second program voltage (VPGMSLC+DVPGM) to the each of selected ones of the plurality of word lines associated with the memory cells to program the memory cells. A final verify is applied to ensure the cells are programed successfully. Thus, the control circuit is also configured to apply at least one final verify pulse to the at least one of the selected ones of the plurality of word lines associated with the memory cells in a final verify operation. The control circuit senses whether the selected one of the strings conducts current while applying the at least one final verify pulse after waiting at least one sense time and counts and saves a final conducting quantity of the memory cells of the selected one of the strings conducting current during the final verify operation. The control circuit additionally determines whether the final conducting quantity of the memory cells of the selected one of the strings conducting current is less than or greater than a final conducting quantity threshold during the final verify operation. The control circuit is configured to add a subsequent delta program voltage to the first program voltage to calculate a subsequent program voltage of a subsequent program pulse in response to determining the final conducting quantity of the memory cells of the selected one of the strings conducting current is not less than or greater than the final conducting quantity threshold during the final verify operation. Next, the control circuit applies the subsequent program pulse having the subsequent program voltage to the at least one of selected ones of the plurality of word lines associated with the memory cells to program the memory cells and return to the final verify operation. The control circuit is configured to repeat the applying the subsequent program pulse and the final verify operation until the distribution of the threshold voltage of the memory cells have the desired program lower tail voltage and this program voltage VPGM is then saved. Thus, the control circuit may also include a program voltage register (e.g., register 515). Therefore, the control circuit is further configured to store an ending or new program voltage equal to the first program voltage VPGMSLC added to the second program voltage VPGMSLC+DVPGM in the program voltage register to be applied to each of the selected ones of the plurality of word lines when programming memory cells connected to each of the selected ones of the plurality of word lines within one of the word line zones and memory cells of other ones of the strings of the block of memory cells in another program operation. So, for programming other strings (e.g., strings 1-4) or other word lines in the same zone, the new program voltage stored in the program voltage register is applied.

FIGS. 12A-12C illustrate example cumulative distribution function (CDF) voltage plots of example memory cells during the one-pulse verify. In more detail, FIG. 12A shows the distribution of the threshold voltages of the memory cells that are "fresh" (e.g., at memory die sort) after being erased. Then, following the first program pulse of the first program voltage VPGMSLC, the program lower tail voltage from the first verify operation using the first sense time FSENSE #2 is then shown 1.4 volts from the desired program lower tail voltage or final lower tail position. The second program pulse using the delta program voltage DVPGM of 2 volts is applied and the distribution of the memory cells end up having the desired program lower tail voltage. FIG. 12B shows the distribution of the threshold voltages of the memory cells that are highly cycled (i.e., have experienced many program and erase cycles) after being erased. Then, following the first program pulse having the first program voltage VPGMSLC. The program lower tail voltage from the first verify operation using the first sense time FSENSE #2 is then shown 1.4 volts from the desired program lower tail voltage or final lower tail position. The second verify operation is carried out using a second verify voltage that is 0.55 volts larger than the first verify voltage used for the first verify operation and using the first sense time FSENSE #2. The distribution of the memory cells from the second verify operation is 0.85 volts lower than the desired program lower tail voltage or final lower tail position. The second program pulse using the delta program voltage DVPGM of 1.4 volts is applied and the distribution of the memory cells end up having the desired program lower tail voltage. FIG. 12C shows the distribution of the threshold voltages of the memory cells after being erased. Next, following the first program pulse having the first program voltage VPGMSLC, the distributions of the memory cells from the first verify operation using the first sense time FSENSE #2 and the second sense time FSENSE #1 are shown. The program lower tail voltage from the distribution from the first verify operation using the first sense time FSENSE #2 is 1.4 volts from the desired program lower tail voltage or final lower tail position. The second program pulse using the delta program voltage DVPGM of 2.4 volts is applied and the distribution of the memory cells end up having the desired program lower tail voltage.

In a specific implementation, the plurality of conducting quantity thresholds may include a first conducting quantity threshold BSPF_1PSV_1_SLC and a second conducting quantity threshold BSPF_1PSV_2_SLC and a third conducting quantity threshold BSPF_1PSV_3_SLC. So, as described above, the control circuit is further configured to apply the first verify pulse of the first verify voltage to the at least one of the selected ones of the plurality of word lines associated with the memory cells in the first verify operation. The control circuit is also configured to sense whether the selected one of the strings conducts current while applying the first verify pulse after waiting each of the first sense time FSENSE #2 and the second sense time FSENSE #1 and count and save the first conducting quantity of the memory cells of the selected one of the strings conducting current during the first verify operation.

So, during the first verify operation, the control circuit determines whether the first conducting quantity of the memory cells of the selected one of the strings conducting current is greater than the first conducting quantity threshold BSPF_1PSV_1_SLC using the first sense time FSENSE #2. The control circuit then determines whether the first conducting quantity of the memory cells of the selected one of the strings conducting current is greater than the second conducting quantity threshold BSPF_1PSV_2_SLC using the first sense time FSENSE #2 during the first verify operation in response to the first conducting quantity of the memory cells of the selected one of the strings conducting current being greater than the first conducting quantity threshold BSPF_1PSV_1_SLC using the first sense time FSENSE #2 during the first verify operation. In addition, the control circuit is configured to select a first primary delta program voltage DVPGM (e.g., 2 volts) in response to the first conducting quantity of the memory cells of the selected one of the strings conducting current being less than the second conducting quantity threshold BSPF_1PSV_2_SLC using the first sense time FSENSE #2 during the first verify operation. The control circuit determines whether the first conducting quantity of the memory cells of the selected one of the strings conducting current is greater than the third conducting quantity threshold BSPF_1PSV_3_SLC using the first sense time FSENSE #2 during the first verify operation in response to the first conducting quantity of the memory cells of the selected one of the strings conducting current being greater than the second conducting quantity threshold BSPF_1PSV_2_SLC using the first sense time FSENSE #2 during the first verify operation. The control circuit is also configured to select a second primary delta program voltage DVPGM (e.g., 2.2 volts) in response to the first conducting quantity of the memory cells of the selected one of the strings conducting current being less than the third conducting quantity threshold BSPF_1PSV_3_SLC using the first sense time FSENSE #2 during the first verify operation. The control circuit determines whether the first conducting quantity of the memory cells of the selected one of the strings conducting current is greater than the second conducting quantity threshold BSPF_1PSV_2_SLC using the second sense time FSENSE #1 during the first verify operation in response to the first conducting quantity of the memory cells of the selected one of the strings conducting current being greater than the third conducting quantity threshold BSPF_1PSV_3_SLC using the first sense time FSENSE #2 during the first verify operation. Then, the control circuit selects a third primary delta program voltage DVPGM (e.g., 2.4 volts) in response to the first conducting quantity of the memory cells of the selected one of the strings conducting current being less than the second conducting quantity threshold BSPF_1PSV_2_SLC using the second sense time FSENSE #1 during the first verify operation. The control circuit is configured to determine whether the first conducting quantity of the memory cells of the selected one of the strings conducting current is greater than the third conducting quantity threshold BSPF_1PSV_3_SLC using the second sense time FSENSE #1 during the first verify operation in response to the first conducting quantity of the memory cells of the selected one of the strings conducting current being greater than the second conducting quantity threshold BSPF_1PSV_2_SLC using the second sense time FSENSE #1 during the first verify operation. Next, the control circuit selects a fourth primary delta program voltage DVPGM (e.g., 2.6 volts) in response to the first conducting quantity of the memory cells of the selected one of the strings conducting current being less than the third conducting quantity threshold BSPF_1PSV_3_SLC using the second sense time FSENSE #1 during the first verify operation.

If the first conducting quantity of the memory cells of the selected one of the strings conducting current less than the first conducting quantity threshold BSPF_1PSV_1_SLC using the first sense time FSENSE #2 during the first verify operation, the control circuit carries out the second verify operation using the second verify pulse having the second verify voltage that is higher than the first verify voltage. Thus, the control circuit is configured to add a primary verify offset voltage (e.g., 0.55 volts) to the first verify voltage to determine a second verify voltage in response to the first conducting quantity of the memory cells of the selected one of the strings conducting current being less than the first conducting quantity threshold BSPF_1PSV_1_SLC using the first sense time FSENSE #2 during the first verify operation. Then, similar to the first verify operation, the control circuit applies the second verify pulse of the second verify voltage to at least one of the selected ones of the plurality of word lines associated with the memory cells during the second verify operation. The control circuit is configured to sense whether the selected one of the strings conducts current while applying the second verify pulse after waiting each of the first sense time FSENSE #2 and the second sense time FSENSE #1 and count and save the second conducting quantity of the memory cells of the selected one of the strings conducting current during the second verify operation.

During the second verify operation, the control circuit determines whether the second conducting quantity of the memory cells of the selected one of the strings conducting current is greater than the first conducting quantity threshold BSPF_1PSV_1_SLC using the first sense time FSENSE #2. Next, the control circuit is configured to select a fifth primary delta program voltage DVPGM (e.g., 0.4 volts) in response to the second conducting quantity of the memory cells of the selected one of the strings conducting current being less than the second conducting quantity threshold BSPF_1PSV_2_SLC using the first sense time FSENSE #2 during the second verify operation. The control circuit additionally determines whether the second conducting quantity of the memory cells of the selected one of the strings conducting current is greater than the second conducting quantity threshold BSPF_1PSV_2_SLC using the first sense time FSENSE #2 during the second verify operation in response to the second conducting quantity of the memory cells of the selected one of the strings conducting current being greater than the second conducting quantity threshold BSPF_1 PSV_2_SLC using the first sense time FSENSE #2 during the second verify operation. The control circuit is also configured to select a sixth primary delta program voltage DVPGM (e.g., 1.2 volts) in response to the second conducting quantity of the memory cells of the selected one of the strings conducting current being less than the second conducting quantity threshold BSPF_1 PSV_2_SLC using the first sense time FSENSE #2 during the second verify operation. Next, the control circuit is configured to determine whether the second conducting quantity of the memory cells of the selected one of the strings conducting current is greater than the third conducting quantity threshold BSPF_1PSV_3_SLC using the first sense time FSENSE #2 during the second verify operation in response to the second conducting quantity of the memory cells of the selected one of the strings conducting current being greater than the second conducting quantity threshold BSPF_1 PSV_2_SLC using the first sense time FSENSE #2 during the second verify operation. The control circuit then selects a seventh primary delta program voltage DVPGM (e.g., 1.4 volts) in response to the second conducting quantity of the memory cells of the selected one of the strings conducting current being less than the third conducting quantity threshold BSPF_1PSV_3_SLC using the first sense time FSENSE #2 during the second verify operation. The control circuit is also configured to determine whether the second conducting quantity of the memory cells of the selected one of the strings conducting current is greater than the second conducting quantity threshold BSPF_1 PSV_2_SLC using the second sense time FSENSE #1 during the second verify operation in response to the second conducting quantity of the memory cells of the selected one of the strings conducting current being greater than the third conducting quantity threshold BSPF_1 PSV_3_SLC using the first sense time FSENSE #2 during the second verify operation. The control circuit is configured to select an eighth primary delta program voltage DVPGM (e.g., 1.6 volts) in response to the second conducting quantity of the memory cells of the selected one of the strings conducting current being less than the second conducting quantity threshold BSPF_1PSV_2_SLC using the second sense time FSENSE #1 during the second verify operation. Additionally, the control circuit determines whether the second conducting quantity of the memory cells of the selected one of the strings conducting current is greater than the third conducting quantity threshold BSPF_1PSV_3_SLC using the second sense time FSENSE #1 during the second verify operation in response to the second conducting quantity of the memory cells of the selected one of the strings conducting current being greater than the second conducting quantity threshold BSPF_1PSV_2_SLC using the second sense time FSENSE #1 during the second verify operation. The control circuit selects a ninth primary delta program voltage DVPGM (e.g., 1.8 volts) in response to the second conducting quantity of the memory cells of the selected one of the strings conducting current being less than the third conducting quantity threshold BSPF_1PSV_3_SLC using the second sense time FSENSE #1 during the second verify operation. Alternatively, the control circuit selects a tenth primary delta program voltage DVPGM (e.g., 1.8 volts, not likely) in response to the second conducting quantity of the memory cells of the selected one of the strings conducting current being greater than the third conducting quantity threshold BSPF_1PSV_3_SLC using the second sense time FSENSE #1 during the second verify operation.

During the first verify operation, if the first conducting quantity of the memory cells of the selected one of the strings conducting current is greater all of the conducting quantity thresholds (e.g., BSPF_1PSV_1_SLC, BSPF_1PSV_2_SLC, BSPF_1PSV_3_SLC, BSPF_1PSV_4_SLC) using the first and second sense times FSENSE #1, FSENSE #2, the control circuit carries out the second verify operation using the second verify pulse having the second verify voltage that is lower than the first verify voltage. Therefore, the control circuit is configured to subtract the primary verify offset voltage (e.g., 0.55 volts) from the first verify voltage to determine the second verify voltage in response to the first conducting quantity of the memory cells of the selected one of the strings conducting current being greater than the third conducting quantity threshold BSPF_1PSV_3_SLC using the second sense time FSENSE #1 during the first verify operation. Next, the control circuit applies the second verify pulse of the second verify voltage to at least one of the selected ones of the plurality of word lines associated with the memory cells during the second verify operation. The control circuit is configured to sense whether the selected one of the strings conducts current while applying the second verify pulse after waiting each of the first sense time FSENSE #2 and the second sense time FSENSE #1 and count and save the second conducting quantity of the memory cells of the selected one of the strings conducting current during the second verify operation.

Thus, during the second verify operation, the control circuit determines whether the second conducting quantity of the memory cells of the selected one of the strings conducting current is greater than the first conducting quantity threshold BSPF_1PSV_1_SLC using the first sense time FSENSE #2. The control circuit selects an eleventh primary delta program voltage DVPGM (e.g., 2.6 volts, not likely) in response to the second conducting quantity of the memory cells of the selected one of the strings conducting current being less than the second conducting quantity threshold BSPF_1PSV_2_SLC using the first sense time FSENSE #2 during the second verify operation. The control circuit is also configured to determine whether the second conducting quantity of the memory cells of the selected one of the strings conducting current is greater than the second conducting quantity threshold BSPF_1PSV_2_SLC using the first sense time FSENSE #2 during the second verify operation in response to the second conducting quantity of the memory cells of the selected one of the strings conducting current being greater than the second conducting quantity threshold BSPF_1PSV_2_SLC using the first sense time FSENSE #2 during the second verify operation. The control circuit selects a twelfth delta program voltage DVPGM (e.g., 2.8 volts) in response to the second conducting quantity of the memory cells of the selected one of the strings conducting current being less than the second conducting quantity threshold BSPF_1PSV_2_SLC using the first sense time FSENSE #2 during the second verify operation. The control circuit then determines whether the second conducting quantity of the memory cells of the selected one of the strings conducting current is greater than the third conducting quantity threshold BSPF_1PSV_3_SLC using the first sense time FSENSE #2 during the second verify operation in response to the second conducting quantity of the memory cells of the selected one of the strings conducting current being greater than the second conducting quantity threshold BSPF_1PSV_2_SLC using the first sense time FSENSE #2 during the second verify operation. The control circuit selects a thirteenth primary delta program voltage DVPGM (e.g., 3 volts) in response to the second conducting quantity of the memory cells of the selected one of the strings conducting current being less than the third conducting quantity threshold BSPF_1PSV_3_SLC using the first sense time FSENSE #2 during the second verify operation. The control circuit then determines whether the second conducting quantity of the memory cells of the selected one of the strings conducting current is greater than the second conducting quantity threshold BSPF_1PSV_2_SLC using the second sense time FSENSE #1 during the second verify operation in response to the second conducting quantity of the memory cells of the selected one of the strings conducting current being greater than the third conducting quantity threshold BSPF_1PSV_3_SLC using the first sense time FSENSE #2 during the second verify operation. The control circuit is configured to select a fourteenth primary delta program voltage DVPGM (e.g., 3.2 volts) in response to the second conducting quantity of the memory cells of the selected one of the strings conducting current being less than the second conducting quantity threshold BSPF_1PSV_2_SLC using the second sense time FSENSE #1 during the second verify operation. The control circuit is also configured to determine whether the second conducting quantity of the memory cells of the selected one of the strings conducting current is greater than the third conducting quantity threshold BSPF_1PSV_3_SLC using the second sense time FSENSE #1 during the second verify operation in response to the second conducting quantity of the memory cells of the selected one of the strings conducting current being greater than the second conducting quantity threshold BSPF_1PSV_2_SLC using the second sense time FSENSE #1 during the second verify operation. The control circuit selects a fifteenth primary delta program voltage DVPGM (e.g., 3.4 volts) in response to the second conducting quantity of the memory cells of the selected one of the strings conducting current being less than the third conducting quantity threshold BSPF_1PSV_3_SLC using the second sense time FSENSE #1 during the second verify operation. Alternatively, the control circuit selects a sixteenth primary delta program voltage DVPGM (e.g., 3.6 volts, not likely) in response to the second conducting quantity of the memory cells of the selected one of the strings conducting current being greater than the third conducting quantity threshold BSPF_1PSV_3_SLC using the second sense FSENSE #1 during the second verify operation.

In another specific implementation, the plurality of conducting quantity thresholds includes a first conducting quantity threshold BSPF_1PSV_1_SLC and a second conducting quantity threshold BSPF_1PSV_2_SLC and a third conducting quantity threshold BSPF_1PSV_3_SLC and a fourth conducting quantity threshold BSPF_1PSV_4_SLC. Consequently, as discussed, the control circuit is further configured to apply the first verify pulse of the first verify voltage to the at least one of the selected ones of the plurality of word lines associated with the memory cells in the first verify operation. The control circuit senses whether the selected one of the strings conducts current while applying the first verify pulse after waiting each of the first sense time FSENSE #2 and the second sense time FSENSE #1 and counts and saves the first conducting quantity of the memory cells of the selected one of the strings conducting current during the first verify operation.

So, during the first verify operation, the control circuit is also configured to determine whether the first conducting quantity of the memory cells of the selected one of the strings conducting current is greater than the first conducting quantity threshold BSPF_1PSV_1_SLC using the first sense time FSENSE #2. The control circuit is configured to determine whether the first conducting quantity of the memory cells of the selected one of the strings conducting current is greater than the second conducting quantity threshold BSPF_1PSV_2_SLC using the first sense time FSENSE #2 during the first verify operation in response to the first conducting quantity of the memory cells of the selected one of the strings conducting current being greater than the first conducting quantity threshold BSPF_1PSV_1_SLC using the first sense time FSENSE #2 during the first verify operation. The control circuit selects a first secondary delta program voltage DVPGM (e.g., 2 volts) in response to the first conducting quantity of the memory cells of the selected one of the strings conducting current being less than the second conducting quantity threshold BSPF_1PSV_2_SLC using the first sense time FSENSE #2 during the first verify operation. The control circuit is also configured to determine whether the first conducting quantity of the memory cells of the selected one of the strings conducting current is greater than the third conducting quantity threshold BSPF_1PSV_3_SLC using the first sense time FSENSE #2 during the first verify operation in response to the first conducting quantity of the memory cells of the selected one of the strings conducting current being greater than the second conducting quantity threshold BSPF_1PSV_2_SLC using the first sense time FSENSE #2 during the first verify operation. The control circuit is configured to select a second secondary delta program voltage DVPGM (e.g., 2.1 volts) in response to the first conducting quantity of the memory cells of the selected one of the strings conducting current being less than the third conducting quantity threshold BSPF_1PSV_3_SLC using the first sense time FSENSE #2 during the first verify operation. The control circuit is configured to determine whether the first conducting quantity of the memory cells of the selected one of the strings conducting current is greater than the fourth conducting quantity threshold BSPF_1PSV_4_SLC using the first sense time FSENSE #2 during the first verify operation in response to the first conducting quantity of the memory cells of the selected one of the strings conducting current being greater than the third conducting quantity threshold BSPF_1PSV_3_SLC using the first sense time FSENSE #2 during the first verify operation. The control circuit selects a third secondary delta program voltage DVPGM (e.g., 2.2 volts) in response to the first conducting quantity of the memory cells of the selected one of the strings conducting current being less than the fourth conducting quantity threshold BSPF_1PSV_4_SLC using the first sense time FSENSE #2 during the first verify operation. The control circuit next determines whether the first conducting quantity of the memory cells of the selected one of the strings conducting current is greater than the first conducting quantity threshold BSPF_1PSV_1_SLC using the second sense time FSENSE #1 during the first verify operation in response to the first conducting quantity of the memory cells of the selected one of the strings conducting current being greater than the fourth conducting quantity threshold BSPF_1PSV_4_SLC using the second sense time FSENSE #1 during the first verify operation. The control circuit selects a fourth secondary delta program voltage DVPGM (e.g., 2.3 volts) in response to the first conducting quantity of the memory cells of the selected one of the strings conducting current being less than the first conducting quantity threshold BSPF_1PSV_1_SLC using the second sense time FSENSE #1 during the first verify operation. The control circuit is configured to determine whether the first conducting quantity of the memory cells of the selected one of the strings conducting current is greater than the second conducting quantity threshold BSPF_1PSV_2_SLC using the second sense time FSENSE #1 during the first verify operation in response to the first conducting quantity of the memory cells of the selected one of the strings conducting current being greater than the first conducting quantity threshold BSPF_1PSV_1_SLC using the first sense time FSENSE #2 during the first verify operation. The control circuit selects a fifth secondary delta program voltage DVPGM (e.g., 2.4 volts) in response to the first conducting quantity of the memory cells of the selected one of the strings conducting current being less than the second conducting quantity threshold BSPF_1PSV_2_SLC using the second sense time FSENSE #1 during the first verify operation. The control circuit determines whether the first conducting quantity of the memory cells of the selected one of the strings conducting current is greater than the third conducting quantity threshold BSPF_1PSV_3_SLC using the second sense time FSENSE #1 during the first verify operation in response to the first conducting quantity of the memory cells of the selected one of the strings conducting current being greater than the second conducting quantity threshold BSPF_1PSV_2_SLC using the second sense time FSENSE #1 during the first verify operation. The control circuit then selects a sixth secondary delta program voltage DVPGM (e.g., 2.5 volts) in response to the first conducting quantity of the memory cells of the selected one of the strings conducting current being less than the third conducting quantity threshold BSPF_1PSV_3_SLC using the second sense time FSENSE #1 during the first verify operation. In addition, the control circuit is configured to determine whether the first conducting quantity of the memory cells of the selected one of the strings conducting current is greater than the fourth conducting quantity threshold BSPF_1PSV_4_SLC using the second sense time FSENSE #1 during the first verify operation in response to the first conducting quantity of the memory cells of the selected one of the strings conducting current being greater than the third conducting quantity threshold BSPF_1PSV_3_SLC using the second sense time FSENSE #1 during the first verify operation. The control circuit selects a seventh secondary delta program voltage DVPGM in response to the first conducting quantity of the memory cells of the selected one of the strings conducting current being less than the fourth conducting quantity threshold BSPF_1PSV_4_SLC using the second sense time FSENSE #1 during the first verify operation.

If the first conducting quantity of the memory cells of the selected one of the strings conducting current less than the first conducting quantity threshold BSPF_1PSV_1_SLC using the first sense time FSENSE #2 during the first verify operation, the control circuit carries out the second verify operation using the second verify pulse having the second verify voltage that is higher than the first verify voltage. Thus, the control circuit is configured to add a secondary verify offset voltage (e.g., 0.5 volts) to the first verify voltage to determine the second verify voltage in response to the first conducting quantity of the memory cells of the selected one of the strings conducting current being less than the first conducting quantity threshold BSPF_1PSV_1_SLC using the first sense time FSENSE #2 during the first verify operation. The control circuit then applies the second verify pulse of the second verify voltage to at least one of the selected ones of the plurality of word lines associated with the memory cells during the second verify operation. The control circuit senses whether the selected one of the strings conducts current while applying the second verify pulse after waiting each of the first sense time FSENSE #2 and the second sense time FSENSE #1 and counts and saves the second conducting quantity of the memory cells of the selected one of the strings conducting current during the second verify operation.

So, during the second verify operation, the control circuit determines whether the second conducting quantity of the memory cells of the selected one of the strings conducting current is greater than the first conducting quantity threshold BSPF_1PSV_1_SLC using the first sense time FSENSE #2. The control circuit selects an eighth secondary delta program voltage DVPGM (e.g., 0.6 volts) in response to the second conducting quantity of the memory cells of the selected one of the strings conducting current being less than the first conducting quantity threshold BSPF_1PSV_1_SLC using the first sense time FSENSE #2 during the second verify operation. The control circuit is configured to determine whether the second conducting quantity of the memory cells of the selected one of the strings conducting current is greater than the second conducting quantity threshold BSPF_1PSV_2_SLC using the first sense time FSENSE #2 during the second verify operation in response to the second conducting quantity of the memory cells of the selected one of the strings conducting current being greater than the first conducting quantity threshold BSPF_1PSV_1_SLC using the first sense time FSENSE #2 during the second verify operation. The control circuit selects a ninth secondary delta program voltage DVPGM (e.g., 1.3 volts) in response to the second conducting quantity of the memory cells of the selected one of the strings conducting current being less than the second conducting quantity threshold BSPF_1PSV_2_SLC using the first sense time FSENSE #2 during the second verify operation. The control circuit is configured to determine whether the second conducting quantity of the memory cells of the selected one of the strings conducting current is greater than the third conducting quantity threshold BSPF_1PSV_3_SLC using the first sense time FSENSE #2 during the second verify operation in response to the second conducting quantity of the memory cells of the selected one of the strings conducting current being greater than the second conducting quantity threshold BSPF_1 PSV_2_SLC using the first sense time FSENSE #2 during the second verify operation. The control circuit selects a tenth secondary delta program voltage DVPGM (e.g., 1.4 volts) in response to the second conducting quantity of the memory cells of the selected one of the strings conducting current being less than the third conducting quantity threshold BSPF_1 PSV_3_SLC using the first sense time FSENSE #2 during the second verify operation. The control circuit is also configured to determine whether the second conducting quantity of the memory cells of the selected one of the strings conducting current is greater than the fourth conducting quantity threshold BSPF_1 PSV_4_SLC using the second sense time FSENSE #1 during the second verify operation in response to the second conducting quantity of the memory cells of the selected one of the strings conducting current being greater than the third conducting quantity threshold BSPF_1PSV_3_SLC using the first sense time FSENSE #2 during the second verify operation. The control circuit selects an eleventh secondary delta program voltage DVPGM (e.g., 1.5 volts) in response to the second conducting quantity of the memory cells of the selected one of the strings conducting current being less than the fourth conducting quantity threshold BSPF_1 PSV_4_SLC using the first sense time FSENSE #2 during the second verify operation. Additionally, the control circuit is configured to determine whether the second conducting quantity of the memory cells of the selected one of the strings conducting current is greater than the first conducting quantity threshold BSPF_1PSV_1_SLC using the second sense time FSENSE #1 during the second verify operation in response to the second conducting quantity of the memory cells of the selected one of the strings conducting current being greater than the first conducting quantity threshold BSPF_1PSV_1_SLC using the second sense time FSENSE #1 during the second verify operation. The control circuit then selects a twelfth secondary delta program voltage DVPGM (e.g., 1.6 volts) in response to the second conducting quantity of the memory cells of the selected one of the strings conducting current being less than the first conducting quantity threshold BSPF_1 PSV_1_SLC using the first sense time FSENSE #2 during the second verify operation. The control circuit is configured to determine whether the second conducting quantity of the memory cells of the selected one of the strings conducting current is greater than the second conducting quantity threshold BSPF_1PSV_2_SLC using the second sense time FSENSE #1 during the second verify operation in response to the second conducting quantity of the memory cells of the selected one of the strings conducting current being greater than the first conducting quantity threshold BSPF_1PSV_1_SLC using the first sense time FSENSE #2 during the second verify operation. Next, the control circuit selects a thirteenth secondary delta program voltage DVPGM (e.g., 1.7 volts) in response to the second conducting quantity of the memory cells of the selected one of the strings conducting current being less than the second conducting quantity threshold BSPF_1PSV_2_SLC using the second sense time FSENSE #1 during the second verify operation. The control circuit is also configured to determine whether the second conducting quantity of the memory cells of the selected one of the strings conducting current is greater than the third conducting quantity threshold BSPF_1 PSV_3_SLC using the second sense time FSENSE #1 during the second verify operation in response to the second conducting quantity of the memory cells of the selected one of the strings conducting current being greater than the second conducting quantity threshold BSPF_1PSV_2_SLC using the second sense time FSENSE #1 during the second verify operation. Next, the control circuit selects a fourteenth secondary delta program voltage DVPGM (e.g., 1.8 volts) in response to the second conducting quantity of the memory cells of the selected one of the strings conducting current being less than the third conducting quantity threshold BSPF_1PSV_3_SLC using the second sense time FSENSE #1 during the second verify operation. The control circuit is additionally configured to determine whether the second conducting quantity of the memory cells of the selected one of the strings conducting current is greater than the fourth conducting quantity threshold BSPF_1PSV_4_SLC using the second sense time FSENSE #1 during the second verify operation in response to the second conducting quantity of the memory cells of the selected one of the strings conducting current being greater than the third conducting quantity threshold BSPF_1PSV_3_SLC using the second sense time FSENSE #1 during the second verify operation. The control circuit selects a fifteenth secondary delta program voltage DVPGM (e.g., 1.9 volts) in response to the second conducting quantity of the memory cells of the selected one of the strings conducting current being less than the fourth conducting quantity threshold BSPF_1PSV_4_SLC using the second sense time FSENSE #1 during the second verify operation. Alternatively, the control circuit selects a sixteenth secondary delta program voltage DVPGM (e.g., 1.9 volts) in response to the second conducting quantity of the memory cells of the selected one of the strings conducting current being greater than the fourth conducting quantity threshold BSPF_1PSV_4_SLC using the second sense time FSENSE #1 during the second verify operation.

During the first verify operation, if the first conducting quantity of the memory cells of the selected one of the strings conducting current is greater all of the conducting quantity thresholds (e.g., BSPF_1PSV_1_SLC, BSPF_1PSV_2_SLC, BSPF_1PSV_3_SLC, BSPF_1PSV_4_SLC) using the first and second sense times FSENSE #1, FSENSE #2, the control circuit carries out the second verify operation using the second verify pulse having the second verify voltage that is lower than the first verify voltage. Therefore, the control circuit is configured to subtract the secondary verify offset voltage (e.g., 0.5 volts) from the first verify voltage to determine the second verify voltage in response to the first conducting quantity of the memory cells of the selected one of the strings conducting current being greater than the third conducting quantity threshold BSPF_1PSV_3_SLC using the second sense time FSENSE #1 during the first verify operation. The control circuit is also configured to apply the second verify pulse of the second verify voltage to at least one of the selected ones of the plurality of word lines associated with the memory cells during the second verify operation. The control circuit senses whether the selected one of the strings conducts current while applying the second verify pulse after waiting each of the first sense time FSENSE #2 and the second sense time FSENSE #1 and counts and saves the second conducting quantity of the memory cells of the selected one of the strings conducting current during the second verify operation.

Thus, during the second verify operation, the control circuit is configured to determine whether the second conducting quantity of the memory cells of the selected one of the strings conducting current is greater than the first conducting quantity threshold BSPF_1PSV_1_SLC using the first sense time FSENSE #2. Next, the control circuit selects a seventeenth secondary delta program voltage DVPGM (e.g., 2.6 volts) in response to the second conducting quantity of the memory cells of the selected one of the strings conducting current being less than the first conducting quantity threshold BSPF_1PSV_1_SLC using the first sense time FSENSE #2 during the second verify operation. The control circuit is also configured to determine whether the second conducting quantity of the memory cells of the selected one of the strings conducting current is greater than the second conducting quantity threshold BSPF_1PSV_2_SLC using the first sense time FSENSE #2 during the second verify operation in response to the second conducting quantity of the memory cells of the selected one of the strings conducting current being greater than the first conducting quantity threshold BSPF_1PSV_1_SLC using the first sense time FSENSE #2 during the second verify operation. The control circuit selects an eighteenth secondary delta program voltage DVPGM (e.g., 2.7 volts) in response to the second conducting quantity of the memory cells of the selected one of the strings conducting current being less than the second conducting quantity threshold BSPF_1PSV_2_SLC using the first sense time FSENSE #2 during the second verify operation. The control circuit is additionally configured to determine whether the second conducting quantity of the memory cells of the selected one of the strings conducting current is greater than the third conducting quantity threshold BSPF_1PSV_3_SLC using the first sense time FSENSE #2 during the second verify operation in response to the second conducting quantity of the memory cells of the selected one of the strings conducting current being greater than the second conducting quantity threshold BSPF_1PSV_2_SLC using the first sense time FSENSE #2 during the second verify operation. The control circuit next selects a nineteenth secondary delta program voltage DVPGM (e.g., 2.8 volts) in response to the second conducting quantity of the memory cells of the selected one of the strings conducting current being less than the third conducting quantity threshold BSPF_1PSV_3_SLC using the first sense time FSENSE #2 during the second verify operation. The control circuit is configured to determine whether the second conducting quantity of the memory cells of the selected one of the strings conducting current is greater than the fourth conducting quantity threshold BSPF_1PSV_4_SLC using the second sense time FSENSE #1 during the second verify operation in response to the second conducting quantity of the memory cells of the selected one of the strings conducting current being greater than the third conducting quantity threshold BSPF_1PSV_3_SLC using the first sense time FSENSE #2 during the second verify operation. The control circuit selects a twentieth secondary delta program voltage DVPGM (e.g., 2.9 volts) in response to the second conducting quantity of the memory cells of the selected one of the strings conducting current being less than the fourth conducting quantity threshold BSPF_1PSV_4_SLC using the first sense time FSENSE #2 during the second verify operation. In addition, the control circuit is configured to determine whether the second conducting quantity of the memory cells of the selected one of the strings conducting current is greater than the first conducting quantity threshold BSPF_1PSV_1_SLC using the second sense time FSENSE #1 during the second verify operation in response to the second conducting quantity of the memory cells of the selected one of the strings conducting current being greater than the first conducting quantity threshold BSPF_1PSV_1_SLC using the second sense time FSENSE #1 during the second verify operation. The control circuit selects a twenty-first secondary delta program voltage DVPGM (e.g., 3 volts) in response to the second conducting quantity of the memory cells of the selected one of the strings conducting current being less than the first conducting quantity threshold BSPF_1PSV_1_SLC using the first sense time FSENSE #2 during the second verify operation. The control circuit also determines whether the second conducting quantity of the memory cells of the selected one of the strings conducting current is greater than the second conducting quantity threshold BSPF_1PSV_2_SLC using the second sense time FSENSE #1 during the second verify operation in response to the second conducting quantity of the memory cells of the selected one of the strings conducting current being greater than the first conducting quantity threshold BSPF_1PSV_1_SLC using the first sense time FSENSE #2 during the second verify operation. The control circuit selects a twenty-second secondary delta program voltage DVPGM (e.g., 3.1 volts) in response to the second conducting quantity of the memory cells of the selected one of the strings conducting current being less than the second conducting quantity threshold BSPF_1PSV_2_SLC using the second sense time FSENSE #1 during the second verify operation. The control circuit is configured to determine whether the second conducting quantity of the memory cells of the selected one of the strings conducting current is greater than the third conducting quantity threshold BSPF_1PSV_3_SLC using the second sense time FSENSE #1 during the second verify operation in response to the second conducting quantity of the memory cells of the selected one of the strings conducting current being greater than the second conducting quantity threshold BSPF_1PSV_2_SLC using the second sense time FSENSE #1 during the second verify operation. The control circuit then selects a twenty-third secondary delta program voltage DVPGM (e.g., 3.2 volts) in response to the second conducting quantity of the memory cells of the selected one of the strings conducting current being less than the third conducting quantity threshold BSPF_1PSV_3_SLC using the second sense time FSENSE #1 during the second verify operation. Next, the control circuit is configured to determine whether the second conducting quantity of the memory cells of the selected one of the strings conducting current is greater than the fourth conducting quantity threshold BSPF_1PSV_4_SLC using the second sense time FSENSE #1 during the second verify operation in response to the second conducting quantity of the memory cells of the selected one of the strings conducting current being greater than the third conducting quantity threshold BSPF_1PSV_3_SLC using the second sense time FSENSE #1 during the second verify operation. The control circuit selects a twenty-fourth secondary delta program voltage DVPGM (e.g., 3.3 volts) in response to the second conducting quantity of the memory cells of the selected one of the strings conducting current being less than the fourth conducting quantity threshold BSPF_1 PSV_4_SLC using the second sense time FSENSE #1 during the second verify operation. Alternatively, the control circuit selects a twenty-fifth secondary delta program voltage DVPGM (e.g., 3.4 volts) in response to the second conducting quantity of the memory cells of the selected one of the strings conducting current being greater than the fourth conducting quantity threshold BSPF_1PSV_4_SLC using the second sense time FSENSE #1 during the second verify operation. While various specific conducting quantity thresholds, verify offset voltages, and delta program voltages DVPGM have been described for the implementations of the one-pulse smart verify above, it should be understood that these are only examples and various other thresholds and voltages may alternatively be used.

According to an aspect, the plurality of word lines are grouped into a plurality of tiers. Consequently, the control circuit is further configured to select an amount of the plurality of tiers for applying the at least one verify voltage pulse to the plurality of word lines associated with the amount of the plurality of tiers selected and sensing whether the selected one of the strings conducts current and count at least one conducting quantity of the memory cells of the selected one of the strings conducting current during the at least one verify operation following the first program pulse. The control circuit also determines the program lower tail voltage based on the at least one conducting quantity of the memory cells of the selected one of the strings conducting current during the at least one verify operation, the at least one conducting quantity of the memory cells being dependent on the amount of the plurality of tiers selected. By looking at a fewer number of tiers (e.g., one tier instead of 16 tiers, a broader range of threshold voltages can be scanned during the at least one verify operation.

FIG. 13 is a table illustrating a comparison between one-pulse smart verify, zero-pulse smart verify, and smart verify operations. As shown, use of the one-pulse smart verify described herein advantageously results in fewer pulses for the first string (Str0), relatively low programming time (tProg) for the first string (Str0). In addition, there is no risk of overprogramming the memory cells and the one-pulse smart verify can be implemented "on-NAND" rather than relying on a host or system controller.

FIG. 14A illustrates steps of an exemplary method of measuring program slope of the memory cells. The method includes the step of 600 starting the measurement of program slope. Next, 602 erasing the memory cells and programming the memory cells using first program pulse having a first program voltage. The method continues by 604 sensing the threshold voltage Vth of the cells relative to one or more verify levels (voltages), of a set of data states (e.g., determining a lower tail voltage or position as described above). The method proceeds with the step of 606 initializing an incremental program voltage dV as 0 millivolts. Next, 608 determining whether the incremental program voltage dV is greater than a predetermined maximum incremental program voltage (e.g., 4 volts). The method continues with the step of 610 erasing the memory cells and programming the memory cells using another first program pulse having the first program voltage (e.g., default program voltage VPGM) in response to the incremental program voltage dV not being greater than the predetermined maximum incremental program voltage. The next step of the method is 612 calculating a new program voltage as the first program voltage added to the incremental program voltage dV. Next, 614 applying a second program pulse being the new program voltage. The next step of the method is 616 sensing the Vth of the cells relative to the one or more verify levels (voltages), of a set of data states (e.g., determining a lower tail voltage). The method proceeds by 618 incrementing the incremental program voltage dV by a predetermined increment (e.g., 0.4 volts) and returning to the step of 608 determining whether the incremental program voltage dV is less than the predetermined maximum incremental program voltage. The method also includes the step of 620 finishing the measurement of program slope in response to the incremental program voltage dV being greater than the predetermined maximum incremental program voltage.

FIG. 14B shows that program slope does not vary with cycling or starting program voltage VPGM. In more detail, the program slope stabilizes at 0.7 if the second program voltage of the second program pulse is less than the first program voltage plus one volt (i.e., VPGM>1V+1st pulse VPGM). So, for example, the program slope can be determined through testing ahead of time (e.g., during design engineering) for a memory apparatus and the delta program voltage DVPGM DVPGM can be selected based on the program slope accordingly and used for the one-pulse smart verify as described herein.

Figure 15:
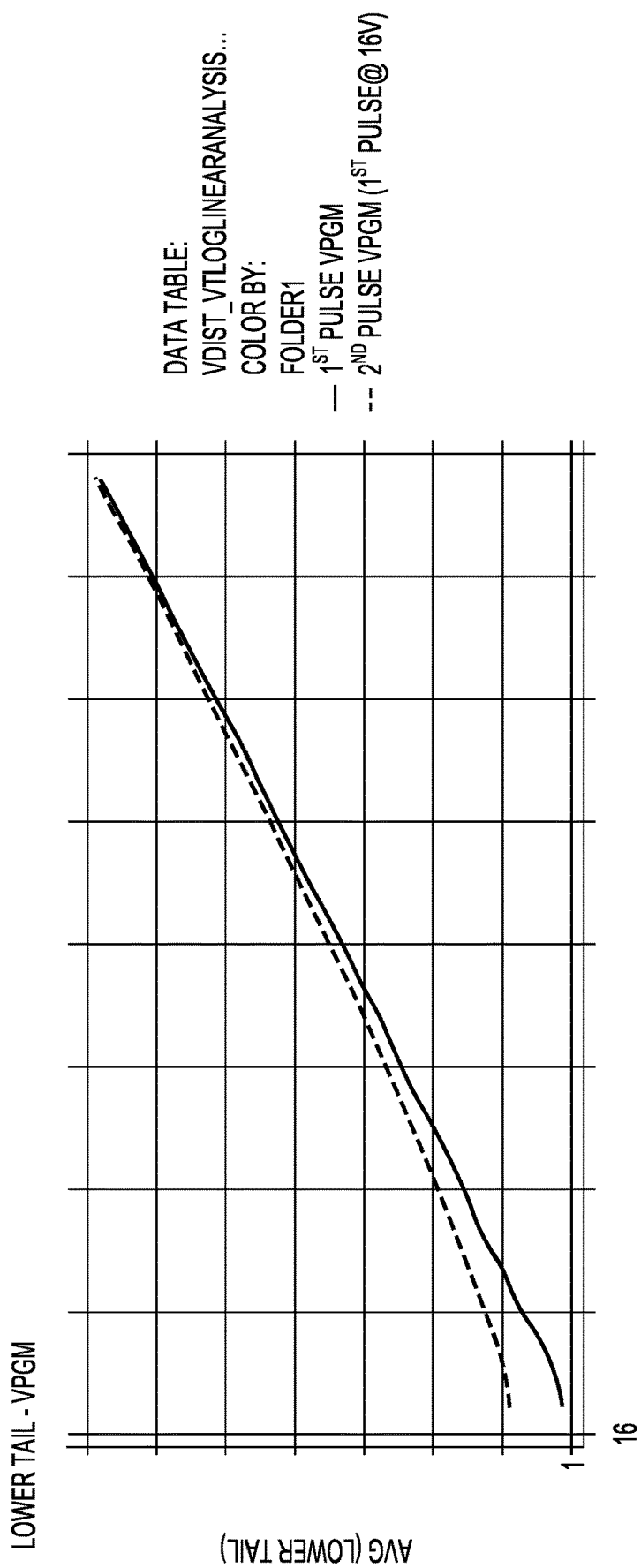
FIG. 15 shows a lower tail position comparison between the first program voltage of the first program pulse and a second program voltage of the second program pulse using the same first program voltage value according to aspects of the disclosure.

FIG. 15 shows a lower tail position comparison between the first program voltage of the first program pulse and the second program voltage of the second program pulse using the same first program voltage value (e.g., 16 volts). If the second program voltage of the second program pulse is greater than 1.5 volts more than the first program voltage of the first program pulse, the resulting lower tail position difference is not significant (<100 millivolts).

Figure 16:
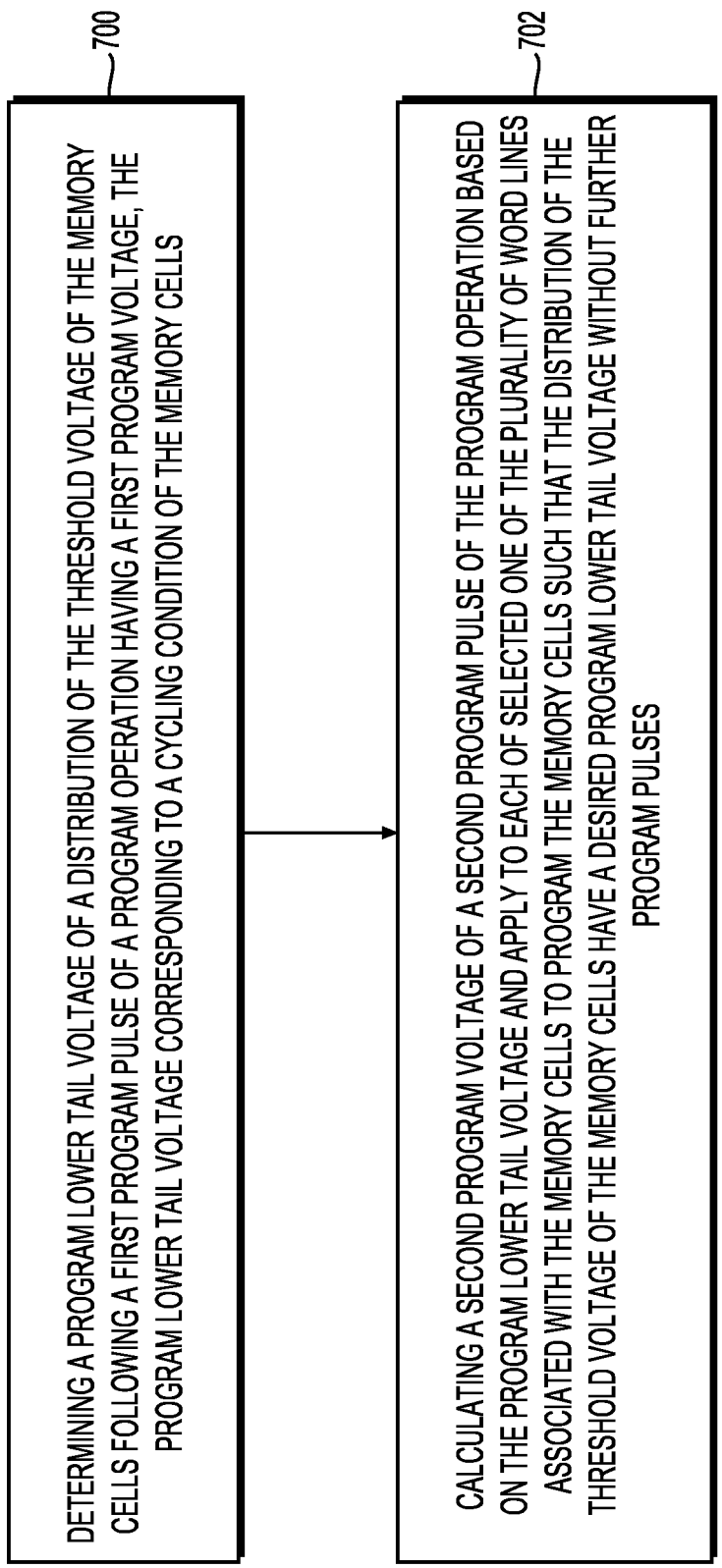
FIGS. 16-19 illustrate steps of a method of operating a memory apparatus according to aspects of the disclosure.

Referring initially to FIG. 16, a method of operating a memory apparatus is also provided. Again, the memory apparatus includes a block of memory cells. Each of the memory cells is connected to one of a plurality of word lines and arranged in strings. Each of the memory cells is also configured to retain a threshold voltage Vth within a common range of threshold voltage defining a threshold window. The method includes the step of 700 determining a program lower tail voltage of a distribution of the threshold voltage of the memory cells following a first program pulse of a program operation having a first program voltage, the program lower tail voltage corresponding to a cycling condition of the memory cells. The method continues with the step of 702 calculating a second program voltage of a second program pulse of the program operation based on the program lower tail voltage and apply to each of selected ones of the plurality of word lines associated with the memory cells to program the memory cells such that the distribution of the threshold voltage of the memory cells have a desired program lower tail voltage without further program pulses.

As discussed above, the first program voltage can be selected so that the program lower tail voltage is a predetermined amount lower than desired program lower tail voltage. Thus, the method can also include the step of selecting the first program voltage so that the program lower tail voltage is a predetermined spacing voltage (e.g., 1.4 volts) lower than desired program lower tail voltage. It should be appreciated that other predetermined spacing voltages may be utilized instead.

The method can also include the step of applying at least one verify voltage pulse to at least one of the selected ones of the plurality of word lines associated with the memory cells while sensing whether a selected one of the strings conducts current and count at least one conducting quantity of the memory cells of the selected one of the strings conducting current during at least one verify operation following the first program pulse. Next, determining the program lower tail voltage based on a comparison of the at least one conducting quantity of the memory cells of the selected one of the strings conducting current during the at least one verify operation to one of a plurality of conducting quantity thresholds (e.g., BSPF_1PSV_1_SLC, BSPF_1PSV_2_SLC, BSPF_1PSV_3_SLC, BSPF_1PSV_4_SLC).

Figure 17:
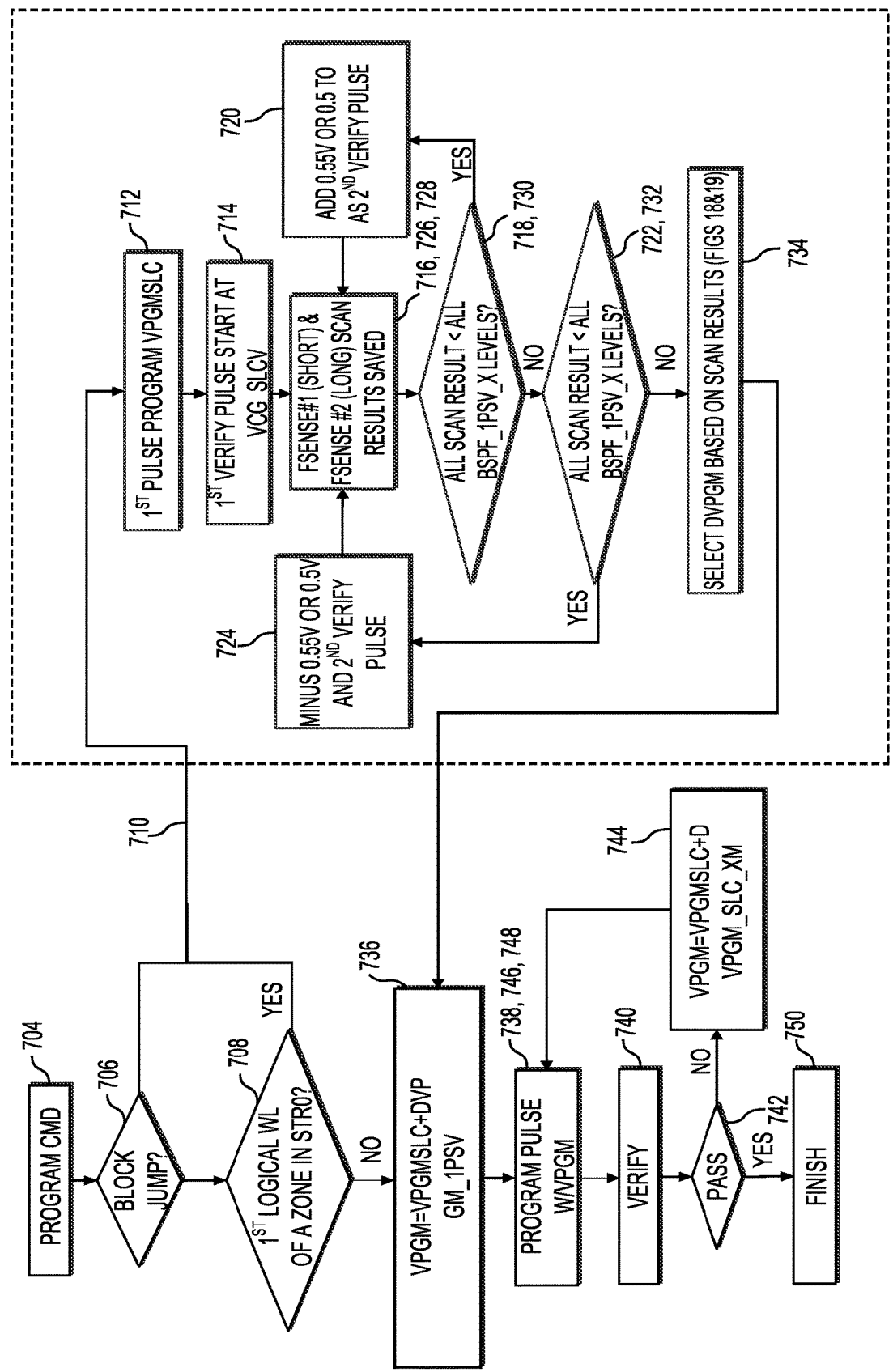

According to an aspect and referring to FIG. 17, the method further includes the steps of 704 receiving a program command to initiate the program operation and 706 determining whether there has been a block jump in response to receiving a program command to initiate the program operation. Next, the method includes the step of 708 determining whether the at least one of the selected ones of the plurality of word lines associated with the memory cells is a first logical word line of a zone in a first string of the strings in response to determining there has not been a block jump. The method continues by 710 beginning the program operation (e.g., including steps 700 and 702 of FIG. 16 and as described above) in response to determining there has been a block jump or determining that the at least one of the selected ones of the plurality of word lines associated with the memory cells is the first logical word line of the zone in the first string of the strings.

As discussed above, the at least one verify operation can include the first verify operation and the second verify operation. Also, the at least one conducting quantity includes a first conducting quantity associated with the first verify operation and a second conducting quantity associated with the second verify operation. So, still referring to FIG. 17, the method includes the step of 712 applying the first program pulse of a first program voltage (VPGMSLC). Next, the method further includes the step of 714 applying a first verify pulse of a first verify voltage to the at least one of the selected ones of the plurality of word lines associated with the memory cells in the first verify operation. The method continues with the step of 716 sensing whether the selected one of the strings conducts current while applying the first verify pulse after waiting each of a plurality of sense times and counting and saving the first conducting quantity of the memory cells of the selected one of the strings conducting current during the first verify operation. The method then includes the step of 718 recursively determining whether the first conducting quantity of the memory cells of the selected one of the strings conducting current is less than one of the plurality of conducting quantity thresholds (e.g., BSPF_1PSV_1_SLC, BSPF_1PSV_2_SLC, BSPF_1PSV_3_SLC, or BSPF_1PSV_4_SLC) during the first verify operation. The method also includes the step of 720 adding one of a plurality of verify offset voltages (e.g., 0.5 volts or 0.55 volts) to the first verify voltage to determine a second verify voltage in response to the first conducting quantity of the memory cells of the selected one of the strings conducting current being less than all of the plurality of conducting quantity thresholds (e.g., BSPF_1PSV_1_SLC, BSPF_1PSV_2_SLC, BSPF_1PSV_3_SLC, and BSPF_1PSV_4_SLC) during the first verify operation. The method also includes the step of 722 recursively determining whether the first conducting quantity of the memory cells of the selected one of the strings conducting current is greater than one of the plurality of conducting quantity thresholds (e.g., BSPF_1PSV_1_SLC, BSPF_1PSV_2_SLC, BSPF_1PSV_3_SLC, or BSPF_1PSV_4_SLC) during the first verify operation in response to the first conducting quantity of the memory cells of the selected one of the strings conducting current not being less than all of the plurality of conducting quantity thresholds (e.g., BSPF_1PSV_1_SLC, BSPF_1PSV_2_SLC, BSPF_1PSV_3_SLC, and BSPF_1PSV_4_SLC) during the first verify operation. The method proceeds by 724 subtracting the one of the plurality of verify offset voltages (e.g., 0.5 volts or 0.55 volts) from the first verify voltage to determine the second verify voltage in response to the first conducting quantity of the memory cells of the selected one of the strings conducting current being greater than all of the plurality of conducting quantity thresholds during the first verify operation. The method then includes the step of 726 applying a second verify pulse of the second verify voltage to at least one of the selected ones of the plurality of word lines associated with the memory cells during the second verify operation. The next step of the method is 728 sensing whether the selected one of the strings conducts current while applying the second verify pulse after waiting each of the plurality of sense times and counting and saving the second conducting quantity of the memory cells of the selected one of the strings conducting current during the second verify operation. The method then includes the step of 730 recursively determining whether the second conducting quantity of the memory cells of the selected one of the strings conducting current is less than one of the plurality of conducting quantity thresholds (e.g., BSPF_1PSV_1_SLC, BSPF_1PSV_2_SLC, BSPF_1PSV_3_SLC, or BSPF_1PSV_4_SLC) during the second verify operation. Next, 732 recursively determining whether the second conducting quantity of the memory cells of the selected one of the strings conducting current is greater than one of the plurality of conducting quantity thresholds (e.g., BSPF_1PSV_1_SLC, BSPF_1PSV_2_SLC, BSPF_1PSV_3_SLC, or BSPF_1PSV_4_SLC) during the second verify operation in response to the second conducting quantity of the memory cells of the selected one of the strings conducting current not being less than all of the plurality of conducting quantity thresholds during the first verify operation (e.g., BSPF_1PSV_1_SLC, BSPF_1PSV_2_SLC, BSPF_1PSV_3_SLC, and BSPF_1PSV_4_SLC). The method also includes the step of 734 selecting one of a plurality of delta program voltages DVPGM based on the recursively determining whether at least one of the first conducting quantity and the second conducting quantity of the memory cells of the selected one of the strings conducting current is less or greater than the one of the plurality of conducting quantity thresholds during at least one of the first verify operation and the second verify operation in response to the second conducting quantity of the memory cells of the selected one of the strings conducting current not being greater than all of the plurality of conducting quantity thresholds during the first verify operation.

In addition, the method includes the step of 736 adding the one of the plurality of delta program voltages DVPGM to the first program voltage VPGMSLC to calculate the second program voltage of the second program pulse in response to selecting the one of the plurality of delta program voltages DVPGM based on the recursively determining whether the at least one of the first conducting quantity and the second conducting quantity of the memory cells of the selected one of the strings conducting current is less or greater than the one of the plurality of conducting quantity thresholds during the at least one of the first verify operation and the second verify operation. Next, the method includes the step of 738 applying the second program pulse having the second program voltage to the each of selected ones of the plurality of word lines associated with the memory cells to program the memory cells.

The method also includes the steps of 740 applying at least one final verify pulse to the at least one of the selected ones of the plurality of word lines associated with the memory cells in a final verify operation and sensing whether the selected one of the strings conducts current while applying the at least one final verify pulse after waiting at least one sense time and counting and saving a final conducting quantity of the memory cells of the selected one of the strings conducting current during the final verify operation. The method then includes 742 determining whether the final conducting quantity of the memory cells of the selected one of the strings conducting current is less than or greater than a final conducting quantity threshold during the final verify operation. The method continues with the step of 744 adding a subsequent delta program voltage DVPGM to the first program voltage to calculate a subsequent program voltage of a subsequent program pulse in response to determining the final conducting quantity of the memory cells of the selected one of the strings conducting current is not less than or greater than the final conducting quantity threshold during the final verify operation. The method then includes the step of 746 applying the subsequent program pulse having the subsequent program voltage to the at least one of selected ones of the plurality of word lines associated with the memory cells to program the memory cells and return to the final verify operation. The method proceeds by 748 repeating the applying the subsequent program pulse and the final verify operation until the distribution of the threshold voltage of the memory cells have the desired program lower tail voltage and 750 ending the one-pulse smart verify.

Figure 18:
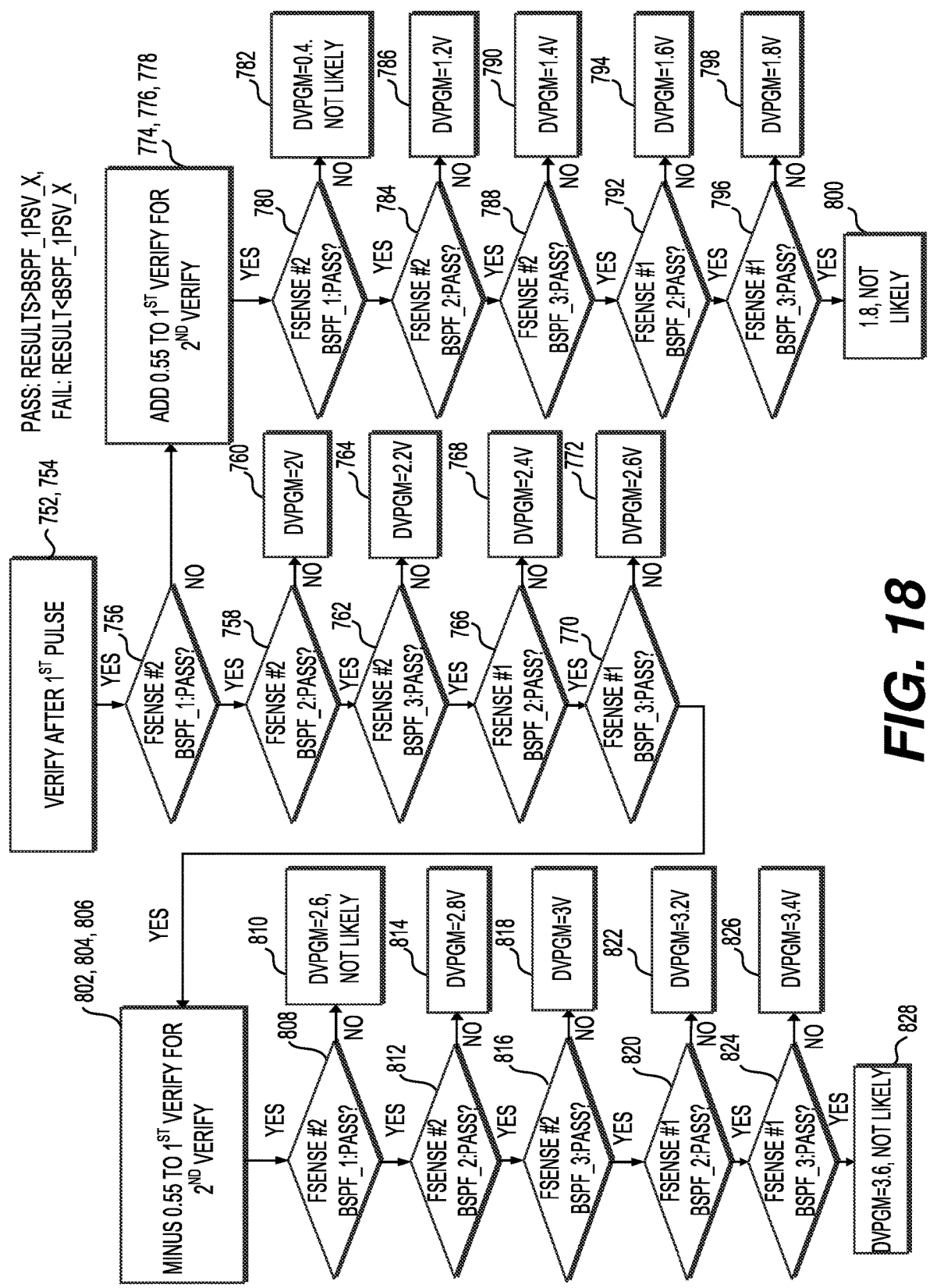

As discussed above, the plurality of conducting quantity thresholds includes a first conducting quantity threshold BSPF_1PSV_1_SLC and a second conducting quantity threshold BSPF_1PSV_2_SLC and a third conducting quantity threshold BSPF_1PSV_3_SLC. Thus, referring to FIG. 18, the method further includes the step of 752 applying a first verify pulse of a first verify voltage to the at least one of the selected ones of the plurality of word lines associated with the memory cells in the first verify operation. The method continues with the step of 754 sensing whether the selected one of the strings conducts current while applying the first verify pulse after waiting each of a first sense time FSENSE #2 and a second sense time FSENSE #1 and counting and saving the first conducting quantity of the memory cells of the selected one of the strings conducting current during the first verify operation. The method then includes the step of 756 determining whether the first conducting quantity of the memory cells of the selected one of the strings conducting current is greater than the first conducting quantity threshold BSPF_1PSV_1_SLC using the first sense time FSENSE #2 during the first verify operation. The next step of the method is 758 determining whether the first conducting quantity of the memory cells of the selected one of the strings conducting current is greater than the second conducting quantity threshold BSPF_1PSV_2_SLC using the first sense time FSENSE #2 during the first verify operation in response to the first conducting quantity of the memory cells of the selected one of the strings conducting current being greater than the first conducting quantity threshold BSPF_1PSV_1_SLC using the first sense time FSENSE #2 during the first verify operation. The method then includes the step of 760 selecting a first primary delta program voltage DVPGM (e.g., 2 volts) in response to the first conducting quantity of the memory cells of the selected one of the strings conducting current being less than the second conducting quantity threshold BSPF_1PSV_2_SLC using the first sense time FSENSE #2 during the first verify operation. The method continues with the step of 762 determining whether the first conducting quantity of the memory cells of the selected one of the strings conducting current is greater than the third conducting quantity threshold BSPF_1PSV_3_SLC using the first sense time FSENSE #2 during the first verify operation in response to the first conducting quantity of the memory cells of the selected one of the strings conducting current being greater than the second conducting quantity threshold BSPF_1PSV_2_SLC using the first sense time FSENSE #2 during the first verify operation. The method next includes the step of 764 selecting a second primary delta program voltage DVPGM (e.g., 2.2 volts) in response to the first conducting quantity of the memory cells of the selected one of the strings conducting current being less than the third conducting quantity threshold BSPF_1PSV_3_SLC using the first sense time FSENSE #2 during the first verify operation. The method proceeds with the step of 766 determining whether the first conducting quantity of the memory cells of the selected one of the strings conducting current is greater than the second conducting quantity threshold BSPF_1PSV_2_SLC using the second sense time FSENSE #1 during the first verify operation in response to the first conducting quantity of the memory cells of the selected one of the strings conducting current being greater than the third conducting quantity threshold BSPF_1PSV_3_SLC using the first sense time FSENSE #2 during the first verify operation. The method continues by 768 selecting a third primary delta program voltage DVPGM (2.4 volts) in response to the first conducting quantity of the memory cells of the selected one of the strings conducting current being less than the second conducting quantity threshold BSPF_1PSV_2_SLC using the second sense time FSENSE #1 during the first verify operation. The method continues with the step of 770 determining whether the first conducting quantity of the memory cells of the selected one of the strings conducting current is greater than the third conducting quantity threshold BSPF_1PSV_3_SLC using the second sense time FSENSE #1 during the first verify operation in response to the first conducting quantity of the memory cells of the selected one of the strings conducting current being greater than the second conducting quantity threshold BSPF_1PSV_2_SLC using the second sense time FSENSE #1 during the first verify operation. Next, 772 selecting a fourth primary delta program voltage DVPGM (e.g., 2.6 volts) in response to the first conducting quantity of the memory cells of the selected one of the strings conducting current being less than the third conducting quantity threshold BSPF_1PSV_3_SLC using the second sense time FSENSE #1 during the first verify operation.

If the first conducting quantity of the memory cells of the selected one of the strings conducting current is less than the first conducting quantity threshold BSPF_1PSV_1_SLC using the first sense time FSENSE #2 during the first verify operation, the second verify operation is carried out using a second verify pulse having a second verify voltage that is higher than the first verify voltage. Thus, the method includes the step of 774 adding a primary verify offset voltage to the first verify voltage to determine a second verify voltage in response to the first conducting quantity of the memory cells of the selected one of the strings conducting current being less than the first conducting quantity threshold BSPF_1PSV_1_SLC using the first sense time FSENSE #2 during the first verify operation. The method then continues with the step of 776 applying a second verify pulse of the second verify voltage to at least one of the selected ones of the plurality of word lines associated with the memory cells during the second verify operation. The method proceeds by 778 sensing whether the selected one of the strings conducts current while applying the second verify pulse after waiting each of the first sense time FSENSE #2 and the second sense time FSENSE #1 and counting and saving the second conducting quantity of the memory cells of the selected one of the strings conducting current during the second verify operation.

So, the method includes the step of 780 determining whether the second conducting quantity of the memory cells of the selected one of the strings conducting current is greater than the first conducting quantity threshold BSPF_1PSV_1_SLC using the first sense time FSENSE #2 during the second verify operation. The method then includes the step of 782 selecting a fifth primary delta program voltage DVPGM (e.g., 0.4 volts, not likely) in response to the second conducting quantity of the memory cells of the selected one of the strings conducting current being less than the second conducting quantity threshold BSPF_1PSV_2_SLC using the first sense time FSENSE #2 during the second verify operation. The method then includes the step of 784 determining whether the second conducting quantity of the memory cells of the selected one of the strings conducting current is greater than the second conducting quantity threshold BSPF_1PSV_2_SLC using the first sense time FSENSE #2 during the second verify operation in response to the second conducting quantity of the memory cells of the selected one of the strings conducting current being greater than the second conducting quantity threshold BSPF_1PSV_2_SLC using the first sense time FSENSE #2 during the second verify operation. Next, the method includes the step of 786 selecting a sixth primary delta program voltage DVPGM (e.g., 1.2 volts) in response to the second conducting quantity of the memory cells of the selected one of the strings conducting current being less than the second conducting quantity threshold BSPF_1PSV_2_SLC using the first sense time FSENSE #2 during the second verify operation. The method also includes the step of 788 determining whether the second conducting quantity of the memory cells of the selected one of the strings conducting current is greater than the third conducting quantity threshold BSPF_1PSV_3_SLC using the first sense time FSENSE #2 during the second verify operation in response to the second conducting quantity of the memory cells of the selected one of the strings conducting current being greater than the second conducting quantity threshold BSPF_1PSV_2_SLC using the first sense time FSENSE #2 during the second verify operation. Next, 790 selecting a seventh primary delta program voltage DVPGM (e.g., 1.4 volts) in response to the second conducting quantity of the memory cells of the selected one of the strings conducting current being less than the third conducting quantity threshold BSPF_1PSV_3_SLC using the first sense time FSENSE #2 during the second verify operation. The next step of the method is 792 determining whether the second conducting quantity of the memory cells of the selected one of the strings conducting current is greater than the second conducting quantity threshold BSPF_1PSV_2_SLC using the second sense time FSENSE #1 during the second verify operation in response to the second conducting quantity of the memory cells of the selected one of the strings conducting current being greater than the third conducting quantity threshold BSPF_1PSV_3_SLC using the first sense time FSENSE #2 during the second verify operation. The method proceeds by 794 selecting an eighth primary delta program voltage DVPGM (e.g., 1.6 volts) in response to the second conducting quantity of the memory cells of the selected one of the strings conducting current being less than the second conducting quantity threshold BSPF_1PSV_2_SLC using the second sense time FSENSE #1 during the second verify operation. The method proceeds with the step of 796 determining whether the second conducting quantity of the memory cells of the selected one of the strings conducting current is greater than the third conducting quantity threshold BSPF_1PSV_3_SLC using the second sense time FSENSE #1 during the second verify operation in response to the second conducting quantity of the memory cells of the selected one of the strings conducting current being greater than the second conducting quantity threshold BSPF_1PSV_2_SLC using the second sense time FSENSE #1 during the second verify operation. Next, 798 selecting a ninth primary delta program voltage DVPGM (e.g., 1.8 volts) in response to the second conducting quantity of the memory cells of the selected one of the strings conducting current being less than the third conducting quantity threshold BSPF_1PSV_3_SLC using the second sense time FSENSE #1 during the second verify operation. Alternatively, the method includes the step of 800 selecting a tenth primary delta program voltage DVPGM (e.g., 1.8 volts, not likely) in response to the second conducting quantity of the memory cells of the selected one of the strings conducting current being greater than the third conducting quantity threshold BSPF_1PSV_3_SLC using the second sense time FSENSE #1 during the second verify operation.

During the first verify operation, if the first conducting quantity of the memory cells of the selected one of the strings conducting current is greater all of the conducting quantity thresholds using the first and second sense times FSENSE #1, FSENSE #2, the second verify operation is carried out using the second verify pulse having the second verify voltage that is lower than the first verify voltage. Therefore, the method includes the step of 802 subtracting the primary verify offset voltage from the first verify voltage to determine the second verify voltage in response to the first conducting quantity of the memory cells of the selected one of the strings conducting current being greater than the third conducting quantity threshold BSPF_1PSV_3_SLC using the second sense time FSENSE #1 during the first verify operation. Next, 804 applying the second verify pulse of the second verify voltage to at least one of the selected ones of the plurality of word lines associated with the memory cells during the second verify operation. The method also includes the step of 806 sensing whether the selected one of the strings conducts current while applying the second verify pulse after waiting each of the first sense time FSENSE #2 and the second sense time FSENSE #1 and counting and saving the second conducting quantity of the memory cells of the selected one of the strings conducting current during the second verify operation.

The method proceeds by 808 determining whether the second conducting quantity of the memory cells of the selected one of the strings conducting current is greater than the first conducting quantity threshold BSPF_1PSV_1_SLC using the first sense time FSENSE #2 during the second verify operation. Next, 810 selecting an eleventh primary delta program voltage DVPGM (e.g., 2.6 volts, not likely) in response to the second conducting quantity of the memory cells of the selected one of the strings conducting current being less than the second conducting quantity threshold BSPF_1PSV_2_SLC using the first sense time FSENSE #2 during the second verify operation. The method continues with the step of 812 determining whether the second conducting quantity of the memory cells of the selected one of the strings conducting current is greater than the second conducting quantity threshold BSPF_1PSV_2_SLC using the first sense time FSENSE #2 during the second verify operation in response to the second conducting quantity of the memory cells of the selected one of the strings conducting current being greater than the second conducting quantity threshold BSPF_1PSV_2_SLC using the first sense time FSENSE #2 during the second verify operation. The next step of the method is 814 selecting a twelfth delta program voltage DVPGM (e.g., 2.8 volts) in response to the second conducting quantity of the memory cells of the selected one of the strings conducting current being less than the second conducting quantity threshold BSPF_1PSV_2_SLC using the first sense time FSENSE #2 during the second verify operation. The method proceeds with the step of 816 determining whether the second conducting quantity of the memory cells of the selected one of the strings conducting current is greater than the third conducting quantity threshold BSPF_1PSV_3_SLC using the first sense time FSENSE #2 during the second verify operation in response to the second conducting quantity of the memory cells of the selected one of the strings conducting current being greater than the second conducting quantity threshold BSPF_1PSV_2_SLC using the first sense time FSENSE #2 during the second verify operation. Next, 818 selecting a thirteenth primary delta program voltage DVPGM (e.g., 3 volts) in response to the second conducting quantity of the memory cells of the selected one of the strings conducting current being less than the third conducting quantity threshold BSPF_1PSV_3_SLC using the first sense time FSENSE #2 during the second verify operation. The method also includes the step of 820 determining whether the second conducting quantity of the memory cells of the selected one of the strings conducting current is greater than the second conducting quantity threshold BSPF_1PSV_2_SLC using the second sense time FSENSE #1 during the second verify operation in response to the second conducting quantity of the memory cells of the selected one of the strings conducting current being greater than the third conducting quantity threshold BSPF_1PSV_3_SLC using the first sense time FSENSE #2 during the second verify operation. The method also includes the step of 822 selecting a fourteenth primary delta program voltage DVPGM (e.g., 3.2 volts) in response to the second conducting quantity of the memory cells of the selected one of the strings conducting current being less than the second conducting quantity threshold BSPF_1PSV_2_SLC using the second sense time FSENSE #1 during the second verify operation. The next step of the method is 824 determining whether the second conducting quantity of the memory cells of the selected one of the strings conducting current is greater than the third conducting quantity threshold BSPF_1PSV_3_SLC using the second sense time FSENSE #1 during the second verify operation in response to the second conducting quantity of the memory cells of the selected one of the strings conducting current being greater than the second conducting quantity threshold BSPF_1PSV_2_SLC using the second sense time FSENSE #1 during the second verify operation. Next, 826 selecting a fifteenth primary delta program voltage DVPGM (e.g., 3.4 volts) in response to the second conducting quantity of the memory cells of the selected one of the strings conducting current being less than the third conducting quantity threshold BSPF_1PSV_3_SLC using the second sense time FSENSE #1 during the second verify operation. Alternatively, the method includes the step of 828 selecting a sixteenth primary delta program voltage DVPGM (e.g., 3.6 volts, not likely) in response to the second conducting quantity of the memory cells of the selected one of the strings conducting current being greater than the third conducting quantity threshold BSPF_1PSV_3_SLC using the second sense time FSENSE #1 during the second verify operation.

Figure 19:
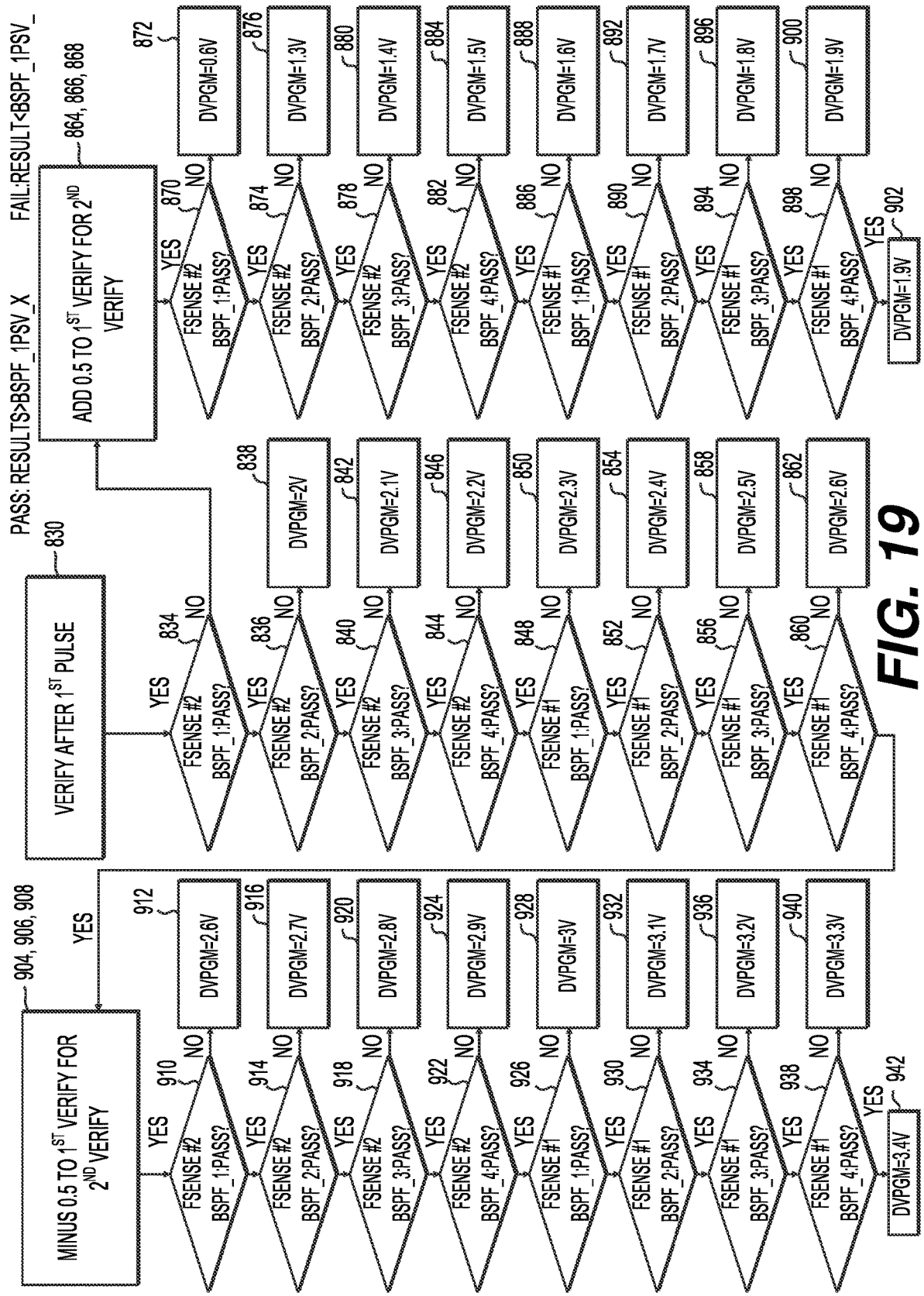

According to an aspect and as discussed above, the plurality of conducting quantity thresholds includes a first conducting quantity threshold BSPF_1PSV_1_SLC and a second conducting quantity threshold BSPF_1PSV_2_SLC and a third conducting quantity threshold BSPF_1PSV_3_SLC and a fourth conducting quantity threshold BSPF_1PSV_4_SLC. Therefore, referring to FIG. 19, the method further includes the step of 830 applying a first verify pulse of a first verify voltage to the at least one of the selected ones of the plurality of word lines associated with the memory cells in the first verify operation. Next, 832 sensing whether the selected one of the strings conducts current while applying the first verify pulse after waiting each of a first sense time FSENSE #2 and a second sense time FSENSE #1 and counting and saving the first conducting quantity of the memory cells of the selected one of the strings conducting current during the first verify operation. The method continues with the step of 834 determining whether the first conducting quantity of the memory cells of the selected one of the strings conducting current is greater than the first conducting quantity threshold BSPF_1PSV_1_SLC using the first sense time FSENSE #2 during the first verify operation. The method then includes the step of 836 determining whether the first conducting quantity of the memory cells of the selected one of the strings conducting current is greater than the second conducting quantity threshold BSPF_1PSV_2_SLC using the first sense time FSENSE #2 during the first verify operation in response to the first conducting quantity of the memory cells of the selected one of the strings conducting current being greater than the first conducting quantity threshold BSPF_1PSV_1_SLC using the first sense time FSENSE #2 during the first verify operation. The method continues with the step of 838 selecting a first secondary delta program voltage DVPGM (e.g., 2 volts) in response to the first conducting quantity of the memory cells of the selected one of the strings conducting current being less than the second conducting quantity threshold BSPF_1PSV_2_SLC using the first sense time FSENSE #2 during the first verify operation. The method continues with the step of 840 determining whether the first conducting quantity of the memory cells of the selected one of the strings conducting current is greater than the third conducting quantity threshold BSPF_1PSV_3_SLC using the first sense time FSENSE #2 during the first verify operation in response to the first conducting quantity of the memory cells of the selected one of the strings conducting current being greater than the second conducting quantity threshold BSPF_1PSV_2_SLC using the first sense time FSENSE #2 during the first verify operation. Next, 842 selecting a second secondary delta program voltage DVPGM (e.g., 2.1 volts) in response to the first conducting quantity of the memory cells of the selected one of the strings conducting current being less than the third conducting quantity threshold BSPF_1PSV_3_SLC using the first sense time FSENSE #2 during the first verify operation. The next step of the method is 844 determining whether the first conducting quantity of the memory cells of the selected one of the strings conducting current is greater than the fourth conducting quantity threshold BSPF_1PSV_4_SLC using the first sense time FSENSE #2 during the first verify operation in response to the first conducting quantity of the memory cells of the selected one of the strings conducting current being greater than the third conducting quantity threshold BSPF_1PSV_3_SLC using the first sense time FSENSE #2 during the first verify operation. The method also includes the step of 846 selecting a third secondary delta program voltage DVPGM (e.g., 2.2 volts) in response to the first conducting quantity of the memory cells of the selected one of the strings conducting current being less than the fourth conducting quantity threshold BSPF_1PSV_4_SLC using the first sense time FSENSE #2 during the first verify operation. The method proceeds with the step of 848 determining whether the first conducting quantity of the memory cells of the selected one of the strings conducting current is greater than the first conducting quantity threshold BSPF_1PSV_1_SLC using the second sense time FSENSE #1 during the first verify operation in response to the first conducting quantity of the memory cells of the selected one of the strings conducting current being greater than the fourth conducting quantity threshold BSPF_1PSV_4_SLC using the second sense time FSENSE #1 during the first verify operation. The next step of the method is 850 selecting a fourth secondary delta program voltage DVPGM (e.g., 2.3 volts) in response to the first conducting quantity of the memory cells of the selected one of the strings conducting current being less than the first conducting quantity threshold BSPF_1PSV_1_SLC using the second sense time FSENSE #1 during the first verify operation. The next step of the method is 852 determining whether the first conducting quantity of the memory cells of the selected one of the strings conducting current is greater than the second conducting quantity threshold BSPF_1PSV_2_SLC using the second sense time FSENSE #1 during the first verify operation in response to the first conducting quantity of the memory cells of the selected one of the strings conducting current being greater than the first conducting quantity threshold BSPF_1PSV_1_SLC using the first sense time FSENSE #2 during the first verify operation. Next, 854 selecting a fifth secondary delta program voltage DVPGM (e.g., 2.4 volts) in response to the first conducting quantity of the memory cells of the selected one of the strings conducting current being less than the second conducting quantity threshold BSPF_1PSV_2_SLC using the second sense time FSENSE #1 during the first verify operation. The method also includes the step of 856 determining whether the first conducting quantity of the memory cells of the selected one of the strings conducting current is greater than the third conducting quantity threshold BSPF_1PSV_3_SLC using the second sense time FSENSE #1 during the first verify operation in response to the first conducting quantity of the memory cells of the selected one of the strings conducting current being greater than the second conducting quantity threshold BSPF_1PSV_2_SLC using the second sense time FSENSE #1 during the first verify operation. The method then includes the step of 858 selecting a sixth secondary delta program voltage DVPGM (e.g., 2.5 volts) in response to the first conducting quantity of the memory cells of the selected one of the strings conducting current being less than the third conducting quantity threshold BSPF_1PSV_3_SLC using the second sense time FSENSE #1 during the first verify operation. The method continues by 860 determining whether the first conducting quantity of the memory cells of the selected one of the strings conducting current is greater than the fourth conducting quantity threshold BSPF_1PSV_4_SLC using the second sense time FSENSE #1 during the first verify operation in response to the first conducting quantity of the memory cells of the selected one of the strings conducting current being greater than the third conducting quantity threshold BSPF_1PSV_3_SLC using the second sense time FSENSE #1 during the first verify operation. Then, the method includes the step of 862 selecting a seventh secondary delta program voltage DVPGM (e.g., 2.6 volts) in response to the first conducting quantity of the memory cells of the selected one of the strings conducting current being less than the fourth conducting quantity threshold BSPF_1PSV_4_SLC using the second sense time FSENSE #1 during the first verify operation.

If the first conducting quantity of the memory cells of the selected one of the strings conducting current less than the first conducting quantity threshold BSPF_1PSV_1_SLC using the first sense time FSENSE #2 during the first verify operation, the second verify operation is carried out using a second verify pulse having a second verify voltage that is higher than the first verify voltage. Thus, the method continues with the step of 864 adding a secondary verify offset voltage to the first verify voltage to determine a second verify voltage in response to the first conducting quantity of the memory cells of the selected one of the strings conducting current being less than the first conducting quantity threshold BSPF_1PSV_1_SLC using the first sense time FSENSE #2 during the first verify operation. Next, 866 applying a second verify pulse of the second verify voltage to at least one of the selected ones of the plurality of word lines associated with the memory cells during the second verify operation. The method also includes the step of 868 sensing whether the selected one of the strings conducts current while applying the second verify pulse after waiting each of the first sense time FSENSE #2 and the second sense time FSENSE #1 and counting and saving the second conducting quantity of the memory cells of the selected one of the strings conducting current during the second verify operation.

So, the method the includes the step of 870 determining whether the second conducting quantity of the memory cells of the selected one of the strings conducting current is greater than the first conducting quantity threshold BSPF_1PSV_1_SLC using the first sense time FSENSE #2 during the second verify operation. The method continues by 872 selecting an eighth secondary delta program voltage DVPGM (e.g., 0.6 volts) in response to the second conducting quantity of the memory cells of the selected one of the strings conducting current being less than the first conducting quantity threshold BSPF_1PSV_1_SLC using the first sense time FSENSE #2 during the second verify operation. The next step of the method is 874 determining whether the second conducting quantity of the memory cells of the selected one of the strings conducting current is greater than the second conducting quantity threshold BSPF_1PSV_2_SLC using the first sense time FSENSE #2 during the second verify operation in response to the second conducting quantity of the memory cells of the selected one of the strings conducting current being greater than the first conducting quantity threshold BSPF_1PSV_1_SLC using the first sense time FSENSE #2 during the second verify operation. The method proceeds with the step of 876 selecting a ninth secondary delta program voltage DVPGM (e.g., 1.3 volts) in response to the second conducting quantity of the memory cells of the selected one of the strings conducting current being less than the second conducting quantity threshold BSPF_1PSV_2_SLC using the first sense time FSENSE #2 during the second verify operation. The next step of the method is 878 determining whether the second conducting quantity of the memory cells of the selected one of the strings conducting current is greater than the third conducting quantity threshold BSPF_1PSV_3_SLC using the first sense time FSENSE #2 during the second verify operation in response to the second conducting quantity of the memory cells of the selected one of the strings conducting current being greater than the second conducting quantity threshold BSPF_1PSV_2_SLC using the first sense time FSENSE #2 during the second verify operation. Next, 880 selecting a tenth secondary delta program voltage DVPGM (e.g., 1.4 volts) in response to the second conducting quantity of the memory cells of the selected one of the strings conducting current being less than the third conducting quantity threshold BSPF_1PSV_3_SLC using the first sense time FSENSE #2 during the second verify operation. The method continues by 882 determining whether the second conducting quantity of the memory cells of the selected one of the strings conducting current is greater than the fourth conducting quantity threshold BSPF_1PSV_4_SLC using the second sense time FSENSE #1 during the second verify operation in response to the second conducting quantity of the memory cells of the selected one of the strings conducting current being greater than the third conducting quantity threshold BSPF_1PSV_3_SLC using the first sense time FSENSE #2 during the second verify operation. The method also includes the steps of 884 selecting an eleventh secondary delta program voltage DVPGM (e.g., 1.5 volts) in response to the second conducting quantity of the memory cells of the selected one of the strings conducting current being less than the fourth conducting quantity threshold BSPF_1PSV_4_SLC using the first sense time FSENSE #2 during the second verify operation. The next step of the method is 886 determining whether the second conducting quantity of the memory cells of the selected one of the strings conducting current is greater than the first conducting quantity threshold BSPF_1PSV_1_SLC using the second sense time FSENSE #1 during the second verify operation in response to the second conducting quantity of the memory cells of the selected one of the strings conducting current being greater than the first conducting quantity threshold BSPF_1PSV_1_SLC using the second sense time FSENSE #1 during the second verify operation. The method also includes the step of 888 selecting a twelfth secondary delta program voltage DVPGM (e.g., 1.6 volts) in response to the second conducting quantity of the memory cells of the selected one of the strings conducting current being less than the first conducting quantity threshold BSPF_1PSV_1_SLC using the first sense time FSENSE #2 during the second verify operation. The method proceeds with the step of 890 determining whether the second conducting quantity of the memory cells of the selected one of the strings conducting current is greater than the second conducting quantity threshold BSPF_1PSV_2_SLC using the second sense time FSENSE #1 during the second verify operation in response to the second conducting quantity of the memory cells of the selected one of the strings conducting current being greater than the first conducting quantity threshold BSPF_1PSV_1_SLC using the first sense time FSENSE #2 during the second verify operation. Next, 892 selecting a thirteenth secondary delta program voltage DVPGM (e.g., 1.7 volts) in response to the second conducting quantity of the memory cells of the selected one of the strings conducting current being less than the second conducting quantity threshold BSPF_1PSV_2_SLC using the second sense time FSENSE #1 during the second verify operation. The method also includes the step of 894 determining whether the second conducting quantity of the memory cells of the selected one of the strings conducting current is greater than the third conducting quantity threshold BSPF_1PSV_3_SLC using the second sense time FSENSE #1 during the second verify operation in response to the second conducting quantity of the memory cells of the selected one of the strings conducting current being greater than the second conducting quantity threshold BSPF_1PSV_2_SLC using the second sense time FSENSE #1 during the second verify operation. The next step of the method is 896 selecting a fourteenth secondary delta program voltage DVPGM (e.g., 1.8 volts) in response to the second conducting quantity of the memory cells of the selected one of the strings conducting current being less than the third conducting quantity threshold BSPF_1PSV_3_SLC using the second sense time FSENSE #1 during the second verify operation. The method also includes the step of 898 determining whether the second conducting quantity of the memory cells of the selected one of the strings conducting current is greater than the fourth conducting quantity threshold BSPF_1PSV_4_SLC using the second sense time FSENSE #1 during the second verify operation in response to the second conducting quantity of the memory cells of the selected one of the strings conducting current being greater than the third conducting quantity threshold BSPF_1PSV_3_SLC using the second sense time FSENSE #1 during the second verify operation. Next, 900 selecting a fifteenth secondary delta program voltage DVPGM (e.g., 1.9 volts) in response to the second conducting quantity of the memory cells of the selected one of the strings conducting current being less than the fourth conducting quantity threshold BSPF_1PSV_4_SLC using the second sense time FSENSE #1 during the second verify operation. Alternatively, the method includes the step of 902 selecting a sixteenth secondary delta program voltage DVPGM (e.g., 1.9 volts) in response to the second conducting quantity of the memory cells of the selected one of the strings conducting current being greater than the fourth conducting quantity threshold BSPF_1PSV_4_SLC using the second sense time FSENSE #1 during the second verify operation.

During the first verify operation, if the first conducting quantity of the memory cells of the selected one of the strings conducting current is greater all of the conducting quantity thresholds using the first and second sense times FSENSE #1, FSENSE #2, the second verify operation is carried out using the second verify pulse having the second verify voltage that is lower than the first verify voltage. Therefore, the method includes the step of 904 subtracting the secondary verify offset voltage from the first verify voltage to determine the second verify voltage in response to the first conducting quantity of the memory cells of the selected one of the strings conducting current being greater than the third conducting quantity threshold BSPF_1PSV_3_SLC using the second sense time FSENSE #1 during the first verify operation. The method also includes the step of 906 applying the second verify pulse of the second verify voltage to at least one of the selected ones of the plurality of word lines associated with the memory cells during the second verify operation. The method also includes the step of 908 sensing whether the selected one of the strings conducts current while applying the second verify pulse after waiting each of the first sense time FSENSE #2 and the second sense time FSENSE #1 and counting and saving the second conducting quantity of the memory cells of the selected one of the strings conducting current during the second verify operation. The method also includes the step of 910 determining whether the second conducting quantity of the memory cells of the selected one of the strings conducting current is greater than the first conducting quantity threshold BSPF_1PSV_1_SLC using the first sense time FSENSE #2 during the second verify operation. Next, 912 selecting a seventeenth secondary delta program voltage DVPGM (e.g., 2.6 volts) in response to the second conducting quantity of the memory cells of the selected one of the strings conducting current being less than the first conducting quantity threshold BSPF_1PSV_1_SLC using the first sense time FSENSE #2 during the second verify operation. The method continues with the step of 914 determining whether the second conducting quantity of the memory cells of the selected one of the strings conducting current is greater than the second conducting quantity threshold BSPF_1PSV_2_SLC using the first sense time FSENSE #2 during the second verify operation in response to the second conducting quantity of the memory cells of the selected one of the strings conducting current being greater than the first conducting quantity threshold BSPF_1PSV_1_SLC using the first sense time FSENSE #2 during the second verify operation. Then, the method includes the step of 916 selecting an eighteenth secondary delta program voltage DVPGM (e.g., 2.7 volts) in response to the second conducting quantity of the memory cells of the selected one of the strings conducting current being less than the second conducting quantity threshold BSPF_1PSV_2_SLC using the first sense time FSENSE #2 during the second verify operation. The method continues by 918 determining whether the second conducting quantity of the memory cells of the selected one of the strings conducting current is greater than the third conducting quantity threshold BSPF_1PSV_3_SLC using the first sense time FSENSE #2 during the second verify operation in response to the second conducting quantity of the memory cells of the selected one of the strings conducting current being greater than the second conducting quantity threshold BSPF_1PSV_2_SLC using the first sense time FSENSE #2 during the second verify operation. Next, 920 selecting a nineteenth secondary delta program voltage DVPGM (e.g., 2.8 volts) in response to the second conducting quantity of the memory cells of the selected one of the strings conducting current being less than the third conducting quantity threshold BSPF_1PSV_3_SLC using the first sense time FSENSE #2 during the second verify operation. The method then includes the step of 922 determining whether the second conducting quantity of the memory cells of the selected one of the strings conducting current is greater than the fourth conducting quantity threshold BSPF_1PSV_4_SLC using the second sense time FSENSE #1 during the second verify operation in response to the second conducting quantity of the memory cells of the selected one of the strings conducting current being greater than the third conducting quantity threshold BSPF_1PSV_3_SLC using the first sense time FSENSE #2 during the second verify operation. Next, 924 selecting a twentieth secondary delta program voltage DVPGM (e.g., 2.9 volts) in response to the second conducting quantity of the memory cells of the selected one of the strings conducting current being less than the fourth conducting quantity threshold BSPF_1PSV_4_SLC using the first sense time FSENSE #2 during the second verify operation. The method proceeds by 926 determining whether the second conducting quantity of the memory cells of the selected one of the strings conducting current is greater than the first conducting quantity threshold BSPF_1PSV_1_SLC using the second sense time FSENSE #1 during the second verify operation in response to the second conducting quantity of the memory cells of the selected one of the strings conducting current being greater than the first conducting quantity threshold BSPF_1PSV_1_SLC using the second sense time FSENSE #1 during the second verify operation. The method also includes the step of 928 selecting a twenty-first secondary delta program voltage DVPGM (e.g., 3 volts) in response to the second conducting quantity of the memory cells of the selected one of the strings conducting current being less than the first conducting quantity threshold BSPF_1PSV_1_SLC using the first sense time FSENSE #2 during the second verify operation. The method continues with the step of 930 determining whether the second conducting quantity of the memory cells of the selected one of the strings conducting current is greater than the second conducting quantity threshold BSPF_1PSV_2_SLC using the second sense time FSENSE #1 during the second verify operation in response to the second conducting quantity of the memory cells of the selected one of the strings conducting current being greater than the first conducting quantity threshold BSPF_1PSV_1_SLC using the first sense time FSENSE #2 during the second verify operation. Next, 932 selecting a twenty-second secondary delta program voltage DVPGM (e.g., 3.1 volts) in response to the second conducting quantity of the memory cells of the selected one of the strings conducting current being less than the second conducting quantity threshold BSPF_1PSV_2_SLC using the second sense time FSENSE #1 during the second verify operation. The method proceeds by 934 determining whether the second conducting quantity of the memory cells of the selected one of the strings conducting current is greater than the third conducting quantity threshold BSPF_1PSV_3_SLC using the second sense time FSENSE #1 during the second verify operation in response to the second conducting quantity of the memory cells of the selected one of the strings conducting current being greater than the second conducting quantity threshold BSPF_1PSV_2_SLC using the second sense time FSENSE #1 during the second verify operation. The method also includes the step of 936 selecting a twenty-third secondary delta program voltage DVPGM (e.g., 3.2 volts) in response to the second conducting quantity of the memory cells of the selected one of the strings conducting current being less than the third conducting quantity threshold BSPF_1PSV_3_SLC using the second sense time FSENSE #1 during the second verify operation. The method then includes the step of 938 determining whether the second conducting quantity of the memory cells of the selected one of the strings conducting current is greater than the fourth conducting quantity threshold BSPF_1PSV_4_SLC using the second sense time FSENSE #1 during the second verify operation in response to the second conducting quantity of the memory cells of the selected one of the strings conducting current being greater than the third conducting quantity threshold BSPF_1PSV_3_SLC using the second sense time FSENSE #1 during the second verify operation. Next, 940 selecting a twenty-fourth secondary delta program voltage DVPGM (e.g., 3.3 volts) in response to the second conducting quantity of the memory cells of the selected one of the strings conducting current being less than the fourth conducting quantity threshold BSPF_1PSV_4_SLC using the second sense time FSENSE #1 during the second verify operation. Alternatively, the method includes the step of 942 selecting a twenty-fifth secondary delta program voltage DVPGM (e.g., 3.4 volts) in response to the second conducting quantity of the memory cells of the selected one of the strings conducting current being greater than the fourth conducting quantity threshold BSPF_1PSV_4_SLC using the second sense time FSENSE #1 during the second verify operation.

As discussed, the plurality of word lines can be grouped into a plurality of tiers. So, the method further includes the step of selecting an amount of the plurality of tiers for applying the at least one verify voltage pulse to the plurality of word lines associated with the amount of the plurality of tiers selected and sensing whether the selected one of the strings conducts current and count at least one conducting quantity of the memory cells of the selected one of the strings conducting current during the at least one verify operation following the first program pulse. The method then includes the step of determining the program lower tail voltage based on the at least one conducting quantity of the memory cells of the selected one of the strings conducting current during the at least one verify operation, the at least one conducting quantity of the memory cells being dependent on the amount of the plurality of tiers selected.

As mentioned above, the memory apparatus can includes a program voltage register and the plurality of word lines are grouped in word line zones. Consequently, the method includes the step of storing an ending program voltage equal to the first program voltage added to the second program voltage in the program voltage register to be applied to each of the selected ones of the plurality of word lines when programming memory cells connected to each of the selected ones of the plurality of word lines within one of the word line zones and memory cells of other ones of the strings of the block of memory cells in another program operation.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top," "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. An apparatus, comprising:
    a block of memory cells, each of the memory cells connected to one of a plurality of word lines and arranged in strings and configured to retain a threshold voltage within a common range of threshold voltages defining a threshold window;
    a control circuit coupled to the plurality of word lines and the strings and configured to:
        determine a program lower tail voltage of a distribution of the threshold voltage of the memory cells following a first program pulse of a program operation having a first program voltage, the program lower tail voltage corresponding to a cycling condition of the memory cells, and
        calculate a second program voltage of a second program pulse of the program operation based on the program lower tail voltage and apply to each of selected ones of the plurality of word lines associated with the memory cells to program the memory cells such that the distribution of the threshold voltage of the memory cells have a desired program lower tail voltage without further program pulses.

2. The apparatus as set forth in claim 1, wherein the control circuit is further configured to:
    apply at least one verify voltage pulse to at least one of the selected ones of the plurality of word lines associated with the memory cells while sensing whether a selected one of the strings conducts current and count at least one conducting quantity of the memory cells of the selected one of the strings conducting current during at least one verify operation following the first program pulse, and
    determine the program lower tail voltage based on a comparison of the at least one conducting quantity of the memory cells of the selected one of the strings conducting current during the at least one verify operation to one of a plurality of conducting quantity thresholds.

3. The apparatus as set forth in claim 2, wherein the at least one verify operation includes a first verify operation and a second verify operation and the at least one conducting quantity includes a first conducting quantity associated with the first verify operation and a second conducting quantity associated with the second verify operation and the control circuit is further configured to:
    apply a first verify pulse of a first verify voltage to the at least one of the selected ones of the plurality of word lines associated with the memory cells in the first verify operation,
    sense whether the selected one of the strings conducts current while applying the first verify pulse after waiting each of a plurality of sense times and count and save the first conducting quantity of the memory cells of the selected one of the strings conducting current during the first verify operation, recursively determine whether the first conducting quantity of the memory cells of the selected one of the strings conducting current is less than one of the plurality of conducting quantity thresholds during the first verify operation, add one of a plurality of verify offset voltages to the first verify voltage to determine a second verify voltage in response to the first conducting quantity of the memory cells of the selected one of the strings conducting current being less than all of the plurality of conducting quantity thresholds during the first verify operation, recursively determine whether the first conducting quantity of the memory cells of the selected one of the strings conducting current is greater than one of the plurality of conducting quantity thresholds during the first verify operation in response to the first conducting quantity of the memory cells of the selected one of the strings conducting current not being less than all of the plurality of conducting quantity thresholds during the first verify operation, subtract the one of the plurality of verify offset voltages from the first verify voltage to determine the second verify voltage in response to the first conducting quantity of the memory cells of the selected one of the strings conducting current being greater than all of the plurality of conducting quantity thresholds during the first verify operation, apply a second verify pulse of the second verify voltage to at least one of the selected ones of the plurality of word lines associated with the memory cells during the second verify operation, sense whether the selected one of the strings conducts current while applying the second verify pulse after waiting each of the plurality of sense times and count and save the second conducting quantity of the memory cells of the selected one of the strings conducting current during the second verify operation, recursively determine whether the second conducting quantity of the memory cells of the selected one of the strings conducting current is less than one of the plurality of conducting quantity thresholds during the second verify operation, recursively determine whether the second conducting quantity of the memory cells of the selected one of the strings conducting current is greater than one of the plurality of conducting quantity thresholds during the second verify operation in response to the second conducting quantity of the memory cells of the selected one of the strings conducting current not being less than all of the plurality of conducting quantity thresholds during the first verify operation, select one of a plurality of delta program voltages based on the recursively determining whether at least one of the first conducting quantity and the second conducting quantity of the memory cells of the selected one of the strings conducting current is less or greater than the one of the plurality of conducting quantity thresholds during at least one of the first verify operation and the second verify operation in response to the second conducting quantity of the memory cells of the selected one of the strings conducting current not being greater than all of the plurality of conducting quantity thresholds during the first verify operation.

4. The apparatus as set forth in claim 3, wherein the control circuit is further configured to:

determine whether there has been a block jump in response to receiving a program command to initiate the program operation, determine whether the at least one of the selected ones of the plurality of word lines associated with the memory cells is a first logical word line of a zone in a first string of the strings in response to determining there has not been a block jump, begin the program operation in response to determining there has been a block jump or determining that the at least one of the selected ones of the plurality of word lines associated with the memory cells is the first logical word line of the zone in the first string of the strings, add the one of the plurality of delta program voltages to the first program voltage to calculate the second program voltage of the second program pulse in response to selecting the one of the plurality of delta program voltages based on the recursively determining whether the at least one of the first conducting quantity and the second conducting quantity of the memory cells of the selected one of the strings conducting current is less or greater than the one of the plurality of conducting quantity thresholds during the at least one of the first verify operation and the second verify operation, apply the second program pulse having the second program voltage to the each of selected ones of the plurality of word lines associated with the memory cells to program the memory cells, apply at least one final verify pulse to the at least one of the selected ones of the plurality of word lines associated with the memory cells in a final verify operation, sense whether the selected one of the strings conducts current while applying the at least one final verify pulse after waiting at least one sense time and count and save a final conducting quantity of the memory cells of the selected one of the strings conducting current during the final verify operation, determine whether the final conducting quantity of the memory cells of the selected one of the strings conducting current is less than or greater than a final conducting quantity threshold during the final verify operation, add a subsequent delta program voltage to the first program voltage to calculate a subsequent program voltage of a subsequent program pulse in response to determining the final conducting quantity of the memory cells of the selected one of the strings conducting current is not less than or greater than the final conducting quantity threshold during the final verify operation, apply the subsequent program pulse having the subsequent program voltage to the at least one of selected ones of the plurality of word lines associated with the memory cells to program the memory cells and return to the final verify operation, and repeat the applying the subsequent program pulse and the final verify operation until the distribution of the threshold voltage of the memory cells have the desired program lower tail voltage.

5. The apparatus as set forth in claim 3, wherein the plurality of sense times includes a first sense time and a second sense time and the control circuit is further configured to select the first program voltage so that the program lower tail voltage is a predetermined spacing voltage lower than the desired program lower tail voltage.

6. The apparatus as set forth in claim 1, wherein the first program voltage is at least 15.5 volts.

7. The apparatus as set forth in claim 1, wherein the plurality of word lines are grouped into a plurality of tiers and the control circuit is further configured to:
   select an amount of the plurality of tiers for applying the at least one verify voltage pulse to the plurality of word lines associated with the amount of the plurality of tiers selected and sensing whether the selected one of the strings conducts current and count at least one conducting quantity of the memory cells of the selected one of the strings conducting current during the at least one verify operation following the first program pulse, and
   determine the program lower tail voltage based on the at least one conducting quantity of the memory cells of the selected one of the strings conducting current during the at least one verify operation, the at least one conducting quantity of the memory cells being dependent on the amount of the plurality of tiers selected.

8. The apparatus as set forth in claim 1, wherein the control circuit includes a program voltage register and the plurality of word lines are grouped in word line zones and the control circuit is further configured to store an ending program voltage equal to the first program voltage added to the second program voltage in the program voltage register to be applied to each of the selected ones of the plurality of word lines when programming memory cells connected to each of the selected ones of the plurality of word lines within one of the word line zones and memory cells of other ones of the strings of the block of memory cells in another program operation.

9. A controller in communication with a memory apparatus including a block of memory cells, each of the memory cells connected to one of a plurality of word lines and arranged in strings and configured to retain a threshold voltage within a common range of threshold voltage defining a threshold window, the controller configured to:
   determine a program lower tail voltage of a distribution of the threshold voltage of the memory cells following a first program pulse of a program operation having a first program voltage, the program lower tail voltage corresponding to a cycling condition of the memory cells; and
   calculate a second program voltage of a second program pulse of the program operation based on the program lower tail voltage and instruct the memory apparatus to apply to each of selected ones of the plurality of word lines associated with the memory cells to program the memory cells such that the distribution of the threshold voltage of the memory cells have a desired program lower tail voltage without further program pulses.

10. The controller as set forth in claim 9, wherein the controller is further configured to:
    instruct the memory apparatus to apply at least one verify voltage pulse to at least one of the selected ones of the plurality of word lines associated with the memory cells while sensing whether a selected one of the strings conducts current and count at least one conducting quantity of the memory cells of the selected one of the strings conducting current during at least one verify operation following the first program pulse; and
    determine the program lower tail voltage based on a comparison of the at least one conducting quantity of the memory cells of the selected one of the strings conducting current during the at least one verify operation to one of a plurality of conducting quantity thresholds.

11. The controller as set forth in claim 10, wherein the at least one verify operation includes a first verify operation and a second verify operation and the at least one conducting quantity includes a first conducting quantity associated with the first verify operation and a second conducting quantity associated with the second verify operation and the controller is further configured to:
    instruct the memory apparatus to apply a first verify pulse of a first verify voltage to the at least one of the selected ones of the plurality of word lines associated with the memory cells in the first verify operation;
    instruct the memory apparatus to sense whether the selected one of the strings conducts current while applying the first verify pulse after waiting each of a plurality of sense times and count and save the first conducting quantity of the memory cells of the selected one of the strings conducting current during the first verify operation;
    recursively determine whether the first conducting quantity of the memory cells of the selected one of the strings conducting current is less than one of the plurality of conducting quantity thresholds during the first verify operation;
    add one of a plurality of verify offset voltages to the first verify voltage to determine a second verify voltage in response to the first conducting quantity of the memory cells of the selected one of the strings conducting current being less than all of the plurality of conducting quantity thresholds during the first verify operation;
    recursively determine whether the first conducting quantity of the memory cells of the selected one of the strings conducting current is greater than one of the plurality of conducting quantity thresholds during the first verify operation in response to the first conducting quantity of the memory cells of the selected one of the strings conducting current not being less than all of the plurality of conducting quantity thresholds during the first verify operation;
    subtract the one of the plurality of verify offset voltages from the first verify voltage to determine the second verify voltage in response to the first conducting quantity of the memory cells of the selected one of the strings conducting current being greater than all of the plurality of conducting quantity thresholds during the first verify operation;
    instruct the memory apparatus to apply a second verify pulse of the second verify voltage to at least one of the selected ones of the plurality of word lines associated with the memory cells during the second verify operation;
    instruct the memory apparatus to sense whether the selected one of the strings conducts current while applying the second verify pulse after waiting each of the plurality of sense times and count and save the second conducting quantity of the memory cells of the selected one of the strings conducting current during the second verify operation;
    recursively determine whether the second conducting quantity of the memory cells of the selected one of the strings conducting current is less than one of the plurality of conducting quantity thresholds during the second verify operation;
    recursively determine whether the second conducting quantity of the memory cells of the selected one of the strings conducting current is greater than one of the plurality of conducting quantity thresholds during the second verify operation in response to the second conducting quantity of the memory cells of the selected one of the strings conducting current not being less than all of the plurality of conducting quantity thresholds during the first verify operation; and select one of a plurality of delta program voltages based on the recursively determining whether at least one of the first conducting quantity and the second conducting quantity of the memory cells of the selected one of the strings conducting current is less or greater than the one of the plurality of conducting quantity thresholds during at least one of the first verify operation and the second verify operation in response to the second conducting quantity of the memory cells of the selected one of the strings conducting current not being greater than all of the plurality of conducting quantity thresholds during the first verify operation.

12. The controller as set forth in claim 11, wherein the controller is further configured to:
   determine whether there has been a block jump in response to receiving a program command to initiate the program operation;
   determining whether the at least one of the selected ones of the plurality of word lines associated with the memory cells is a first logical word line of a zone in a first string of the strings in response to determining there has not been a block jump;
   begin the program operation in response to determining there has been a block jump or determining that the at least one of the selected ones of the plurality of word lines associated with the memory cells is the first logical word line of the zone in the first string of the strings;
   add the one of the plurality of delta program voltages to the first program voltage to calculate the second program voltage of the second program pulse in response to selecting the one of the plurality of delta program voltages based on the recursively determining whether the at least one of the first conducting quantity and the second conducting quantity of the memory cells of the selected one of the strings conducting current is less or greater than the one of the plurality of conducting quantity thresholds during the at least one of the first verify operation and the second verify operation;
   instruct the memory apparatus to apply the second program pulse having the second program voltage to the each of selected ones of the plurality of word lines associated with the memory cells to program the memory cells;
   instruct the memory apparatus to apply at least one final verify pulse to the at least one of the selected ones of the plurality of word lines associated with the memory cells in a final verify operation;
   instruct the memory apparatus to sense whether the selected one of the strings conducts current while applying the at least one final verify pulse after waiting at least one sense time and count and save a final conducting quantity of the memory cells of the selected one of the strings conducting current during the final verify operation;
   determine whether the final conducting quantity of the memory cells of the selected one of the strings conducting current is less than or greater than a final conducting quantity threshold during the final verify operation;
   add a subsequent delta program voltage to the first program voltage to calculate a subsequent program voltage of a subsequent program pulse in response to determining the final conducting quantity of the memory cells of the selected one of the strings conducting current is not less than or greater than the final conducting quantity threshold during the final verify operation;
   instruct the memory apparatus to apply the subsequent program pulse having the subsequent program voltage to the at least one of selected ones of the plurality of word lines associated with the memory cells to program the memory cells and return to the final verify operation; and
   instruct the memory apparatus to repeat the applying the subsequent program pulse and the final verify operation until the distribution of the threshold voltage of the memory cells have the desired program lower tail voltage.

13. A method of operating a memory apparatus including a block of memory cells, each of the memory cells connected to one of a plurality of word lines and arranged in strings and configured to retain a threshold voltage within a common range of threshold voltage defining a threshold window, the method comprising the steps of:
   determining a program lower tail voltage of a distribution of the threshold voltage of the memory cells following a first program pulse of a program operation having a first program voltage, the program lower tail voltage corresponding to a cycling condition of the memory cells; and
   calculating a second program voltage of a second program pulse of the program operation based on the program lower tail voltage and apply to each of selected ones of the plurality of word lines associated with the memory cells to program the memory cells such that the distribution of the threshold voltage of the memory cells have a desired program lower tail voltage without further program pulses.

14. The method as set forth in claim 13, further including the steps of:
   applying at least one verify voltage pulse to at least one of the selected ones of the plurality of word lines associated with the memory cells while sensing whether a selected one of the strings conducts current and count at least one conducting quantity of the memory cells of the selected one of the strings conducting current during at least one verify operation following the first program pulse; and
   determining the program lower tail voltage based on a comparison of the at least one conducting quantity of the memory cells of the selected one of the strings conducting current during the at least one verify operation to one of a plurality of conducting quantity thresholds.

15. The method as set forth in claim 14, wherein the at least one verify operation includes a first verify operation and a second verify operation and the at least one conducting quantity includes a first conducting quantity associated with the first verify operation and a second conducting quantity associated with the second verify operation and the method further includes the steps of:
   applying a first verify pulse of a first verify voltage to the at least one of the selected ones of the plurality of word lines associated with the memory cells in the first verify operation;

sensing whether the selected one of the strings conducts current while applying the first verify pulse after waiting each of a plurality of sense times and counting and saving the first conducting quantity of the memory cells of the selected one of the strings conducting current during the first verify operation;

recursively determining whether the first conducting quantity of the memory cells of the selected one of the strings conducting current is less than one of the plurality of conducting quantity thresholds during the first verify operation;

adding one of a plurality of verify offset voltages to the first verify voltage to determine a second verify voltage in response to the first conducting quantity of the memory cells of the selected one of the strings conducting current being less than all of the plurality of conducting quantity thresholds during the first verify operation;

recursively determining whether the first conducting quantity of the memory cells of the selected one of the strings conducting current is greater than one of the plurality of conducting quantity thresholds during the first verify operation in response to the first conducting quantity of the memory cells of the selected one of the strings conducting current not being less than all of the plurality of conducting quantity thresholds during the first verify operation;

subtracting the one of the plurality of verify offset voltages from the first verify voltage to determine the second verify voltage in response to the first conducting quantity of the memory cells of the selected one of the strings conducting current being greater than all of the plurality of conducting quantity thresholds during the first verify operation;

applying a second verify pulse of the second verify voltage to at least one of the selected ones of the plurality of word lines associated with the memory cells during the second verify operation;

sensing whether the selected one of the strings conducts current while applying the second verify pulse after waiting each of the plurality of sense times and counting and saving the second conducting quantity of the memory cells of the selected one of the strings conducting current during the second verify operation;

recursively determining whether the second conducting quantity of the memory cells of the selected one of the strings conducting current is less than one of the plurality of conducting quantity thresholds during the second verify operation;

recursively determining whether the second conducting quantity of the memory cells of the selected one of the strings conducting current is greater than one of the plurality of conducting quantity thresholds during the second verify operation in response to the second conducting quantity of the memory cells of the selected one of the strings conducting current not being less than all of the plurality of conducting quantity thresholds during the first verify operation; and selecting one of a plurality of delta program voltages based on the recursively determining whether at least one of the first conducting quantity and the second conducting quantity of the memory cells of the selected one of the strings conducting current is less or greater than the one of the plurality of conducting quantity thresholds during at least one of the first verify operation and the second verify operation in response to the second conducting quantity of the memory cells of the selected one of the strings conducting current not being greater than all of the plurality of conducting quantity thresholds during the first verify operation.

16. The method as set forth in claim 15, the method further including the steps of:

determining whether there has been a block jump in response to receiving a program command to initiate the program operation;

determining whether the at least one of the selected ones of the plurality of word lines associated with the memory cells is a first logical word line of a zone in a first string of the strings in response to determining there has not been a block jump;

beginning the program operation in response to determining there has been a block jump or determining that the at least one of the selected ones of the plurality of word lines associated with the memory cells is the first logical word line of the zone in the first string of the strings;

adding the one of the plurality of delta program voltages to the first program voltage to calculate the second program voltage of the second program pulse in response to selecting the one of the plurality of delta program voltages based on the recursively determining whether the at least one of the first conducting quantity and the second conducting quantity of the memory cells of the selected one of the strings conducting current is less or greater than the one of the plurality of conducting quantity thresholds during the at least one of the first verify operation and the second verify operation;

applying the second program pulse having the second program voltage to the each of selected ones of the plurality of word lines associated with the memory cells to program the memory cells;

applying at least one final verify pulse to the at least one of the selected ones of the plurality of word lines associated with the memory cells in a final verify operation;

sensing whether the selected one of the strings conducts current while applying the at least one final verify pulse after waiting at least one sense time and counting and saving a final conducting quantity of the memory cells of the selected one of the strings conducting current during the final verify operation;

determining whether the final conducting quantity of the memory cells of the selected one of the strings conducting current is less than or greater than a final conducting quantity threshold during the final verify operation;

adding a subsequent delta program voltage to the first program voltage to calculate a subsequent program voltage of a subsequent program pulse in response to determining the final conducting quantity of the memory cells of the selected one of the strings conducting current is not less than or greater than the final conducting quantity threshold during the final verify operation;

applying the subsequent program pulse having the subsequent program voltage to the at least one of selected ones of the plurality of word lines associated with the memory cells to program the memory cells and return to the final verify operation; and repeating the applying the subsequent program pulse and the final verify operation until the distribution of the threshold voltage of the memory cells have the desired program lower tail voltage.

17. The method as set forth in claim 15, wherein the plurality of sense times includes a first sense time and a second sense time and the method further includes the step of selecting the first program voltage so that the program lower tail voltage is a predetermined spacing voltage lower than the desired program lower tail voltage.

18. The method as set forth in claim 13, wherein the first program voltage is at least 15.5 volts.

19. The method as set forth in claim 13, wherein the plurality of word lines are grouped into a plurality of tiers and the method further includes the steps of:

selecting an amount of the plurality of tiers for applying the at least one verify voltage pulse to the plurality of word lines associated with the amount of the plurality of tiers selected and sensing whether the selected one of the strings conducts current and count at least one conducting quantity of the memory cells of the selected one of the strings conducting current during the at least one verify operation following the first program pulse; and determining the program lower tail voltage based on the at least one conducting quantity of the memory cells of the selected one of the strings conducting current during the at least one verify operation, the at least one conducting quantity of the memory cells being dependent on the amount of the plurality of tiers selected.

20. The method as set forth in claim 13, wherein the memory apparatus includes a program voltage register and the plurality of word lines are grouped in word line zones and the method includes the step of storing an ending program voltage equal to the first program voltage added to the second program voltage in the program voltage register to be applied to each of the selected ones of the plurality of word lines when programming memory cells connected to each of the selected ones of the plurality of word lines within one of the word line zones and memory cells of other ones of the strings of the block of memory cells in another program operation.

* * * * *